United States Patent
Oh et al.

(10) Patent No.: US 8,456,918 B2
(45) Date of Patent: Jun. 4, 2013

(54) NAND FLASH MEMORY DEVICE AND METHOD OF OPERATING SAME TO REDUCE A DIFFERENCE BETWEEN CHANNEL POTENTIALS THEREIN

(75) Inventors: Dong-Yean Oh, Seoul (KR);
Woon-Kyung Lee, Seongnam-si (KR);
Jai Hyuk Song, Seoul (KR);
Chang-Sub Lee, Andong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 505 days.

(21) Appl. No.: 12/405,826

(22) Filed: Mar. 17, 2009

(65) Prior Publication Data

US 2009/0257280 A1      Oct. 15, 2009

(30) Foreign Application Priority Data

Apr. 14, 2008  (KR) ........................ 10-2008-0034316

(51) Int. Cl.
*G11C 11/34*    (2006.01)
*G11C 16/06*    (2006.01)

(52) U.S. Cl.
USPC ............ 365/185.23; 365/185.18; 365/185.19; 365/185.17; 365/185.02; 365/189.09; 365/230.06

(58) Field of Classification Search
USPC ........................................ 365/185.01–185.33
See application file for complete search history.

(56) References Cited

U.S. PATENT DOCUMENTS

| | | | | |
|---|---|---|---|---|
| 5,661,682 A * | 8/1997 | Lim et al. | ................. | 365/185.17 |
| 5,677,873 A * | 10/1997 | Choi et al. | ............... | 365/185.17 |
| 6,049,494 A * | 4/2000 | Sakui et al. | .................... | 365/203 |
| 6,061,270 A * | 5/2000 | Choi | ......................... | 365/185.02 |
| 6,804,150 B2 * | 10/2004 | Park et al. | ................ | 365/185.18 |
| 7,486,554 B2 * | 2/2009 | Park et al. | ................ | 365/185.02 |
| 7,511,996 B2 * | 3/2009 | Kim | ......................... | 365/185.02 |
| 2005/0068808 A1 | 3/2005 | Quader et al. | | |
| 2006/0028876 A1 | 2/2006 | Quader et al. | | |

FOREIGN PATENT DOCUMENTS

| | | |
|---|---|---|
| CN | 1856840 | 11/2006 |
| KR | 1020050109835 | 11/2005 |
| KR | 1020060107697 | 10/2006 |
| KR | 1020070002319 | 1/2007 |
| KR | 100761470 | 9/2007 |

* cited by examiner

*Primary Examiner* — Kretelia Graham
(74) *Attorney, Agent, or Firm* — F. Chau & Associates, LLC

(57) ABSTRACT

An flash memory device includes a block of NAND cell units, each NAND cell unit in the block includes n memory cell transistors MC controlled by a plurality of n wordlines, and is connected in series between a string selection transistor SST connected to a bitline and a ground selection transistor GST. While a programming voltage Vpgm is applied to a selected wordline WL<i>, a cutoff voltage Vss is applied to a nearby unselected wordline closer to the ground selection transistor GST to isolate a first local channel Ch1 from a second local channel Ch2. As the location i of the selected wordline WL<i> increases close to the SST, the second channel potential Vch2 tends to increase excessively, causing errors. The excessive increase of Vch2 is prevented by modifying the voltages applied to string select lines (SSL) and/or to the bit lines (BL), or the pass voltages Vpass applied to the unselected wordlines (WL<i+1 through WL<n→), only if the selected wordline WL<i> location i is equal or greater than a predetermined (stored) location number x. If incremental step pulse programming (ISPP) is implemented, the applied voltages are modified only if the ISPP loop count j is equal or greater than a predetermined (stored) critical loop number y.

12 Claims, 21 Drawing Sheets

Fig. 3

| Symbol & Signal | Bias Condition | |
|---|---|---|
| BL | BL | Vcc |
| SSL | SSL | Vcc ± α |
| WL<n-1> | WL<n-1> | Vpass |
| ⋮ | ⋮ | |
| WL<i+3> | WL<i+3> | |
| WL<i+2> | WL<i+2> | |
| WL<i+1> | WL<i+1> | |
| WL<i> | WL<i> | Vpgm |
| WL<i-1> | WL<i-1> | Vpass |
| WL<i-2> | WL<i-2> | Vss |
| WL<i-3> | WL<i-3> | Vpass |
| ⋮ | ⋮ | |
| WL<0> | WL<0> | |
| GSL | GSL | Vss |
| CSL | CSL | $V_{CSL}$ |

Fig. 14

| Symbol & Signal | | Bias Condition |
|---|---|---|
| BL | BL | Vcc |
| SSL | SSL | Vcc |
| WL<n-1> | WL<n-1> | Vpass(n-1) |
| ⋮ | ⋮ | ⋮ |
| WL<i+3> | WL<i+3> | Vpass(i+3) |
| WL<i+2> | WL<i+2> | Vpass(i+2) |
| WL<i+1> | WL<i+1> | Vpass(i+1) |
| WL<i> | WL<i> | Vpgm |
| WL<i-1> | WL<i-1> | Vpass |
| WL<i-2> | WL<i-2> | Vss |
| WL<i-3> | WL<i-3> | Vpass |
| ⋮ | ⋮ | |
| WL<0> | WL<0> | |
| GSL | GSL | Vss |
| CSL | CSL | $V_{CSL}$ |

Case
① $Vpass(i+1) < Vpass(i+2) < \cdots Vpass(n-1)$
② $Vpass(i+1) > Vpass(i+2) > Vpass(i+3) > \cdots > Vpass(n-1)$
③ $Vpass(i+1) \sim Vpass(i+\ell) = Vpass,$
   $Vpass(i+\ell+1) \sim Vpass(n-1) = $ Multi pass valtage

NAND FLASH MEMORY DEVICE AND METHOD OF OPERATING SAME TO REDUCE A DIFFERENCE BETWEEN CHANNEL POTENTIALS THEREIN

CROSS-REFERENCE TO RELATED APPLICATIONS

This application claims priority under 35 U.S.C. 119 to Korean patent application no. 10-2008-0034316, filed on Apr. 14, 2008, the entire content of which is incorporated by reference herein.

TECHNICAL FIELD

The present disclosure generally relates to flash memory devices, and more particularly, to a method of biasing unselected memory cell transistors in a flash memory device during programming to reduce program errors due to hot carrier effect.

DISCUSSION OF THE RELATED ART

Non-volatile memory devices, such as flash memory devices, may be provided in a NOR-type configuration or a NAND-type configuration and can be electrically rewritten and formed with high integration density. NAND-type nonvolatile semiconductor memory devices include a plurality of NAND cell units. Each NAND cell unit is configured by serially connecting a plurality of memory transistors in a column direction between a source and a drain. Selection gate (SG) transistors are connected to at each end of the series-connected memory transistor circuit.

Two types of non-volatile memory transistors are floating gate type memory transistors and floating trap (charge trap) type memory transistors. A floating gate type memory transistor includes a control gate and a conductive floating gate that is isolated, by an insulating layer, from a field effect transistor (FET) channel formed in a substrate. Floating gate type memory transistors may be programmed by storing charges as free carriers on the conductive floating gate.

A floating gate type memory transistor is similar to a standard MOSFET transistor, except that it has two gates instead of just one. One gate is the control gate (CG) like in other MOSFET transistors, but the second gate is a floating gate (FG) that is surrounded by an oxide insulator. Because the FG is isolated by its insulating oxide layer, any electrons placed on it get trapped there and thus store the information.

When electrons are trapped on the FG, they modify (partially cancel out) an electric field coming from the CG, which modifies the threshold voltage (Vt) of the cell. Thus, when the cell is "read" by placing a specific voltage on the control gate (CG), electrical current will either flow or not flow between the cell's source and drain connections, depending on the threshold voltage (Vt) of the cell. This presence or absence of current is sensed and translated into 1's and 0's, reproducing the stored data.

Charge trap type memory transistors may include a non-conductive charge storage layer between a gate electrode and a field effect transistor (FET) channel formed in a substrate. Floating trap type memory transistors may be programmed by storing charges in traps in the non-conductive charge storage layer.

When a positive voltage is applied on the gate electrode, electrons are tunneled via the tunneling insulating layer 20 to become trapped in the charge storage layer. As the electrons are accumulated in the charge storage layer, the threshold voltage of the memory transistor is increased, and the memory transistor becomes programmed. When a negative voltage is applied to the gate electrode, trapped electrons are discharged to the semiconductor substrate via the tunneling insulating layer. Concurrently, holes become trapped by the tunneling insulating layer, the threshold voltage of the memory transistor is decreased, and the memory transistor is erased.

NAND Flash memory strings typically are isolated from other strings by shallow trench isolation (STI) to prevent electrical current leakage between adjacent semiconductor device components. A NAND memory string includes three types of transistors: the memory transistor transistors (implementing nonvolatile data-storage); string select transistors SST; and ground select transistors GST. Typically, in a NAND flash memory device, string selection and ground selection transistors (SSL and GSL) are disposed at the ends of a NAND string and are used to select the NAND string during program, erase and read operations.

A group of NAND cell units (NAND strings) arranged in a row direction is called a NAND cell block (memory block, MB). The gates of selection transistors SST and GST arranged on the same row are commonly connected to a corresponding one of selection gate lines and the control gates of memory transistors arranged on the same row are commonly connected to a corresponding one of control gate lines. If n memory transistors are serially connected in the NAND cell unit, the number of control gate lines (word lines WL<>) of memory transistors contained in one NAND cell unit is also n.

When programming data, first, all data items stored in all memory transistors of memory storage cells in the entire memory block (MB) are simultaneously erased. The erase process is performed by setting all of the control gate lines (word lines) of memory transistors in the selected memory block to a low voltage Vss (for example, 0V) and applying high positive voltage Vera (erase voltage, for example, 20V) to a p-type well region in which the memory cell array is formed to discharge electrons in the floating gates into the channel regions. As a result, all data items stored in all memory transistors of memory storage cells in the entire memory block are all set to "1" data. Multiple or all memory blocks can be simultaneously erased.

After the above-described simultaneous data erase step, the data programming process is simultaneously performed for a plurality of memory transistors connected to a selected control gate line. The unit of binary data to be programmed in the memory transistors connected to a selected control gate line is generally defined as one "page" of data. The "page" order in which data is programmed into the memory transistors (pages) in the memory block is based either on a system in which data is programmed in a random order (random programming process) or on a system in which data is sequentially programmed in one direction (sequential programming process). In the sequential programming process, generally, data is programmed in sequential pages in order from the source-side memory transistor.

If high positive voltage Vpgm (program voltage, for example, 20V) is applied to a selected control gate line in the simultaneous programming process, electrons are injected from the channel of the memory transistor into the floating gate in the case of "0" data. This is the so-called "0" programming or "0" write. In this case, injection of electrons is inhibited in the case of "1" data (so-called program inhibition, "1" programming or "1" write). Thus, while writing random data into memory transistors of one page, two types of data programming operations are simultaneously performed and it is necessary to control the channel voltage of each memory transistor according to its program data. For example, in the case of "0" data, the channel voltage is kept low so as to apply a strong electric field to the gate insulating film under the floating gate when the program voltage Vpgm is applied to the control gate. In the case of "1" data, the channel voltage is boosted so as to make weak the electric field applied to the gate insulating film and inhibit injection of electrons into the floating gate. If the channel voltage is insufficiently boosted, electrons are injected so that the threshold voltage of the memory transistor to be subjected to the "1" programming process will be changed. This phenomenon is referred as "erroneous programming" or "write error". Therefore, in order to realize the programming operation of the NAND type flash EEPROM, it is necessary to suppress variation in the threshold voltage due to erroneous programming within a specified range, so as not to cause erroneous operation.

Various types of NAND channel voltage control methods are known. Self-boost (SB) programming methods are commonly used for setting all of the channel regions of the NAND cell unit into an electrically floating state in the "1" data programming case and boosting the channel voltage by use of capacitive coupling with the control gate. The self-boost programming method is described in K. D. Suh et. al., IEEE Journal of Solid-State Circuits, vol. 30, No. 11 (1995) pp. 1149-1156.

Another self-boost system, a local self-boost system (LSB), is described in U.S. Pat. No. 5,715,194 and U.S. Pat. No. 6,930,921. The local self-boost system (LSB) is a sequential programming method for sequentially programming data starting from the control gate line (word line) on the common source line CSL side (e.g., word line WL<xx>). The local self-boost (LSB) system is to set the memory transistors on both sides of the selected memory transistor (WL<i>) into the cut-off state, to electrically isolate only the channel and diffusion layers (boosted region) of the selected memory transistor (WL<i>) from the remaining memory transistors, to set the above regions into the electrically floating state and boost the voltage thereof.

An erased area self-boost (EASB) system is another self-boost system. An erased area self-boost system is described in Jpn. Pat. Appln. KOKAI Publication No. 10-283788. The EASB system is based on sequentially programming data starting from the control gate line on the common source line CSL side as described before. A low voltage Vcutoff is applied to the control gate line (word line) of the memory cell transistor which lies adjacent to and on the common source line CSL side of the selected memory cell transistor so as to cut off the memory cell transistor. Program voltage Vpgm is applied to the control gate line of the selected memory cell transistor (WL<i>) and intermediate voltage Vpass is applied to the other non-selected control gate lines.

For more precise control of threshold-voltage distributions of programmed memory cells, an incremental step pulse programming (ISPP) mode is often used. In applying the ISPP mode, a programming voltage applied to a word line rises stepwise during repetition of loops of programming cycle. The programming voltage increases by a predetermined step increment ($\Delta V$), also referred to as a "rising rate". During the programming sequence, a cell threshold voltage of a programmed cell increases at a rate predetermined for each programming loop. Programming of a nonvolatile memory device by means of the ISPP mode is disclosed in U.S. Pat. No. 6,266,270, entitled "Non-Volatile Semiconductor Memory and Programming Method of the Same". Each programming loop generally is divided into programming and program-verifying periods. In the programming period, memory cells are programmed under a given bias condition. In the program-verifying period, the memory cells programmed once are verified whether they are conditioned in the target threshold voltages. The programming loops are repeated for a predetermined number of times until all memory cells are completely programmed at the target threshold voltages. The program-verifying operation is similar to a reading operation, except that read data is not output to external of the device.

SUMMARY OF THE INVENTION

An aspect of the invention provides a method of programming a flash cell unit having n memory cell transistors MC<0> through MC<n-1>, respectively controlled by n wordlines WL<0> through WL<n-1>, connected to a string selection transistor SST controlled by a string selection line SSL, the method comprising: applying a first predetermined voltage Vcc to the string selection line SSL; and applying a predetermined second voltage (Vcc−α or Vcc+α) to the SSL while applying a programming voltage Vpgm to a selected wordline WL<i'> to reduce channel potential of at least a plurality of the memory cell transistors.

In some embodiments of the invention, the method comprises: applying a first predetermined voltage Vcc to the string selection line SSL while applying the programming voltage Vpgm to a first selected word line WL<i> while $0 \leq i < x$; and at a different (e.g., later) time applying the predetermined second voltage (Vcc−α or Vcc+α) to the string selection line SSL while applying the programming voltage Vpgm to the second selected wordline WL<i'>, while $i' \geq x$, to reduce the local channel potential of memory cell transistors MC<i'> through MC<n-1>, wherein the second selected wordline WL<i'> is nearer than the first selected wordline WL<i> to the string selection line SSL.

In various embodiments, the predetermined second voltage applied to the string selection line (SSL) is Vcc−α, and a is between about 0.1 volts and 3.0 volts, and Vcc is between about 2.5 volts and about 3.5 volts, and Vpass is between about 8 volts and about 10 volts and Vpgm is between about 15 volts and about 20 volts.

Another aspect of the invention provides a method of programming a flash cell unit having n memory cell transistors MC<0> through MC<n-1> respectively controlled by n wordlines WL<0> through WL<n-1> connected to a string selection transistor SST controlled by a string selection line SSL. The method comprises applying at time t a first predetermined voltage Vcc to the bit line BL while programming a first selected memory cell transistor MC<i> on a first selected word line WL<i> while $0 \leq i < x$; and at a different time applying a predetermined second voltage Vcc−α to the bit line BL while programming the a second selected memory cell transistor MC<i'> on a second selected wordline WL<i'>, while $i' \geq x$, to reduce the local channel potential of memory cell transistors MC<i'> through MC<n-1>, wherein the second selected wordline WL<i'> is nearer than the first selected wordline WL<i> to the string selection line SSL.

Some embodiments of the method further comprise: applying a first predetermined voltage Vcc to the bit line BL while incremental step pulse programming (ISPP) is applied to the first selected memory cell transistor MC<i> on the first selected word line WL<i> while $0 \leq i < x$; and at a different time counting the incremental step pulse programming (ISPP) loops while ISPP programming a second selected memory cell transistor MC<i'> on a second selected wordline WL<i'>, while $i' \geq x$; and ONLY WHILE the ISPP loop count j is greater than or equal to y, applying a predetermined second voltage Vcc−α to the bit line BL, to reduce the local channel potential of memory cell transistors MC<i'> through MC<n−1>, while ISPP programming the second selected memory cell transistor MC<i'> on the second selected word-line WL<i'>, while i'≧x.

Alternative embodiments of present invention may approximately equalize the adjacent channel voltages of more than two locals channel (ch1, ch2, ch3 . . . ).

Another aspect of the invention provides a method of programming a flash cell unit having n memory cell transistors MC<0> through MC<n−1> respectively controlled by n wordlines WL<0> through WL<n−1> connected to a string selection transistor SST controlled by a string selection line SSL. The method comprises: applying a pass voltage Vpass to unselected wordlines WL<i+1> through WL<n−1> while applying the programming voltage Vpgm to the first selected word line WL<i>, while 0≦i<x, wherein Vpgm>Vpass>0; and afterwards applying one of a first, second and third different pass voltages Vpass1, Vpass2, and Vpass3 to each of three of the unselected wordlines WL<i'+1> through WL<n−1> while applying the programming voltage Vpgm to a second selected wordline WL<i'>, while i≧x, to reduce the local channel potential of memory cell transistors MC<i'> through MC<n−1>, wherein the second selected wordline WL<i'> is nearer than the first selected wordline WL<i> to the string selection line SSL.

In some exemplary embodiments Vpass1<Vpass, and Vpass3>Vpass. In some exemplary embodiments Vpass1 is applied to WL<i'+1> and Vpass3 is applied to WL<n−1>. In some exemplary embodiments Vpass1 is applied to WL<n−1> and Vpass3 is applied to WL<i'+1>. In some exemplary embodiments Vpass is applied to is WL<i'+1>, WL<i+2, and WL<i+1>, while Vpass1 is applied to WL<i'+I+1>, while Vpass3 is applied to WL<n−1>.

Another aspect of the invention provides a flash memory device, comprising: a memory block including a plurality of m NAND cell units sharing n wordlines WL<> and a string selection line (SSL), each NAND cell unit including a string selection transistor (SST) controlled by the SSL and connected in series between a bitline BL<> and a plurality of n memory transistors respectively controlled by the n wordlines WL<>; and peripheral circuitry adapted to apply a first predetermined voltage Vcc to the string selection line (SSL) while programming the m memory transistors controlled by a first selected wordline WL<i>, and to afterwards apply a predetermined second voltage Vcc±α to the string selection line (SSL) while programming the m memory transistors controlled by a second selected wordline WL<i'>, wherein the second selected wordline WL<i'> is nearer to the string selection line (SSL) than the first selected wordline WL<i>.

The memory transistors may be formed as memory transistors each having a floating gate in addition to a control gate. Alternatively, the memory transistors may be formed as charge-trap type memory transistors.

Another aspect of the invention provides a solid state memory module for a computer system, the module comprising: a housing; an interface connector on the housing; a flash memory controller located within the housing; the flash memory device of claim according to an exemplary embodiment of the invention located within the housing and electrically connected to the interface connector, the plurality of memory transistor transistors in the integrated circuit being arranged in an array for data storage and controlled by the flash memory controller. The interface connector may be an IDE interface connector including a forty IDE pin interface and a power connector, or the housing may have an SD card form factor and the interface connector has eight electrical contact pads. Alternatively, the housing may have the form factor of any of a MS (memory stick), CF (compact flash), SMC (smart media), MMC (multi media), SD (Secure Digital), or XD (XD-Picture Card).

Another aspect of the invention provides a computer system comprising the solid state memory module. The computer system may be a personal computer (PC), a personal digital assistant (PDA), an MP3 player, a digital audio recorder, a pen-shaped computer, a digital camera, or a video recorder.

Another aspect of the invention provides a flash memory device, comprising: a memory block including a plurality of m NAND cell units sharing n wordlines WL<> and a string selection line (SSL), each NAND cell unit including a string selection transistor (SST) controlled by the SSL and connected in series between a bitline BL<> and a plurality of n memory transistors respectively controlled by the n wordlines WL<>; and a page buffer circuit adapted to apply a first predetermined voltage Vcc to the bit lines BL<> while programming the m memory transistors controlled by a first selected wordline WL<i>, and to afterwards apply a predetermined reduced voltage Vcc−α to the bit lines BL<> while programming the m memory transistors controlled by a second selected wordline WL<i'>, wherein the second selected wordline WL<i'> is nearer to the string selection line (SSL) than the first selected wordline WL<i>.

The flash memory device may further comprise peripheral circuitry including the page buffer circuit and adapted to apply the first predetermined voltage Vcc the string selection line (SSL) while programming the m memory transistors controlled by the first selected wordline WL<i>, and to afterwards apply the predetermined reduced voltage Vcc−α to the string selection line (SSL) while programming the m memory transistors controlled by the second selected wordline WL<i'>. The peripheral circuitry may further include an incremental step pulse programming (ISPP) loop counter and may apply the predetermined reduced voltage Vcc−α to the bit lines BL<> while programming the m memory transistors controlled by the second selected wordline WL<> only while the ISPP loop count j is not less than a predetermined value y.

Another aspect of the invention provides a flash memory device, comprising: a memory block including a plurality of m NAND cell units sharing n wordlines WL<> and a string selection line (SSL), each NAND cell unit including a string selection transistor (SST) controlled by the SSL and connected in series between a bitline BL<> and a plurality of n memory transistors respectively controlled by the n wordlines WL<>; and peripheral circuitry adapted to apply a first predetermined pass voltage Vpass(1) to each of a first plurality of unselected wordlines (WL<0> to WL<i−3>) while applying a programming voltage Vpgm higher than Vpass(1) to a selected wordline WL<i>, and to simultaneously apply second and third predetermined pass voltages Vpass(2), Vpass(3) to a second plurality of unselected wordlines (WL<i+1> to WL<n−1>), wherein the second plurality of unselected wordlines are nearer to the string selection line (SSL) than the first plurality of unselected wordlines, wherein the second predetermined pass voltage Vpass(2) is less than the first predetermined pass voltage Vpass(1), and the first predetermined pass voltage Vpass(1) is less than the third predetermined pass voltages Vpass(3).

BRIEF DESCRIPTION OF THE DRAWINGS

The above and other features of exemplary embodiments of the present invention will become readily apparent to persons skilled in the art by reference to the following detailed description when considered in conjunction with the accompanying drawings in which like numerals generally designate the same or similar elements throughout the application and in the several drawings, and wherein:

FIG. 3 is a combination circuit diagram of the NAND cell unit 131 of FIG. 2, and a table of bias voltages applied therein in the flash memory device 100 of FIG. 2;

FIG. 14 is a combination circuit diagram of the NAND cell unit 131 of FIG. 13, and a table of bias voltages, e.g., k intermediate pass voltages Vpass(k) applied to the unselected word lines, therein during the write (program) mode of operation of the flash memory device 400 of FIG. 13;

DETAILED DESCRIPTION OF EXEMPLARY EMBODIMENTS

Figure 1:
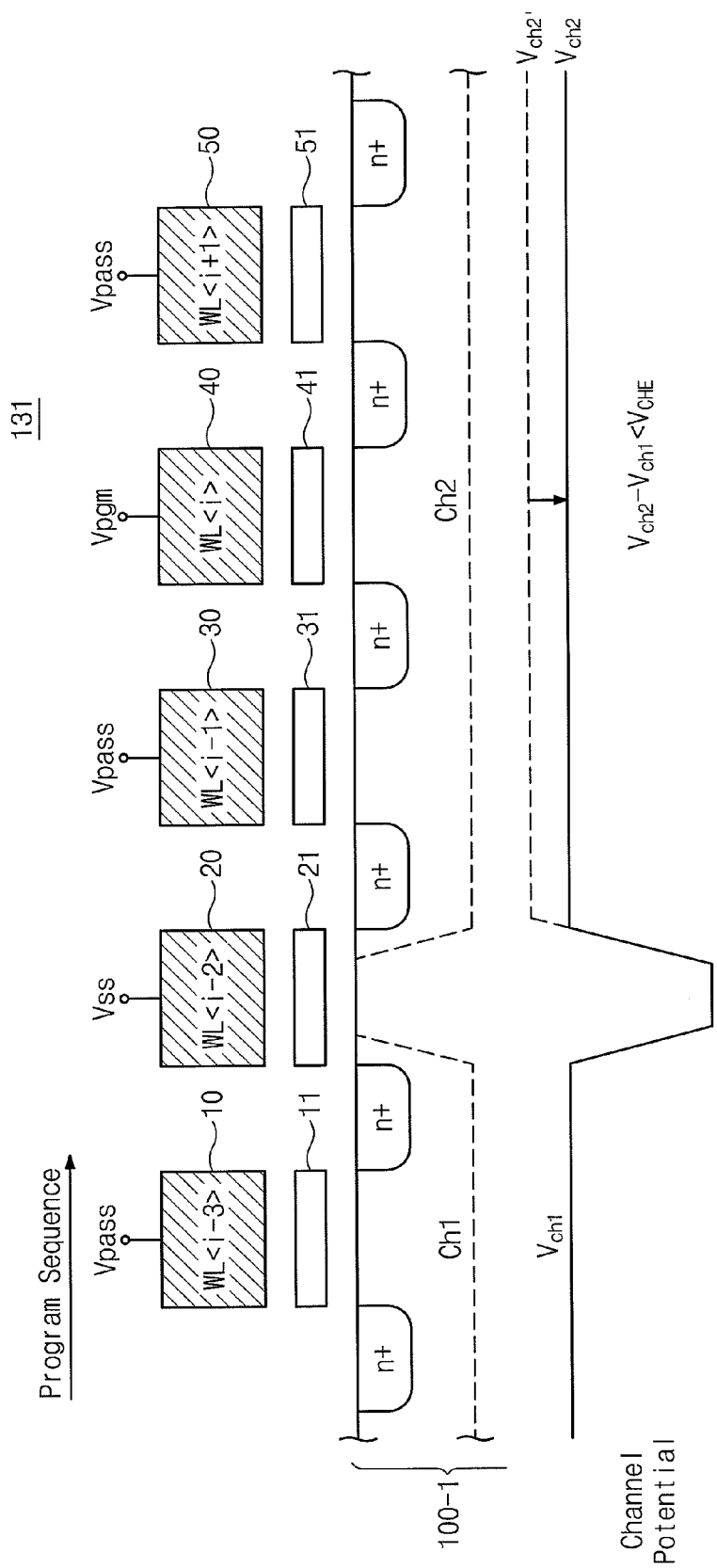
FIG. 1 is a side cross-sectional view of a floating-gate type NAND cell unit 131, formed in an integrated circuit in memory devices (100, 200, 300, 400, or 500 in FIGS. 2, 6, 10, 13 and 17 respectively), having adjacent channel potentials Vch1 and Vch2 approximately equalized according to various exemplary embodiments of the present invention.
Figure 2:
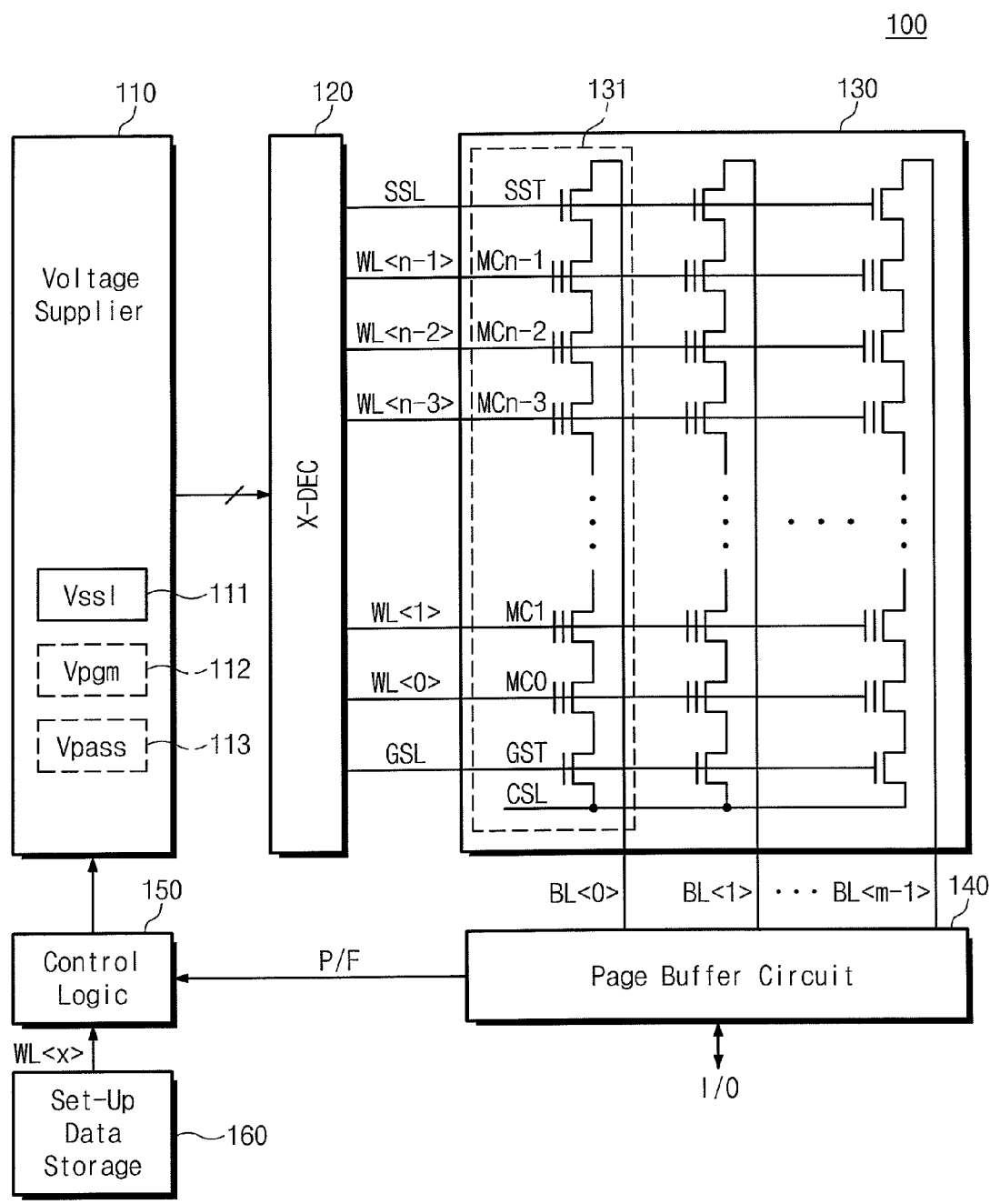
FIG. 2 is a block diagram of a flash memory device 100 including peripheral circuitry 110, 120, 140, 150 and 160 adapted to approximately equalize adjacent channel potentials Vch1 and Vch2 in the NAND cell unit 131 of FIG. 2 according to a first exemplary embodiment of the present invention.

FIG. 1 is a cross-sectional view of a floating-gate type NAND cell unit 131, formed in an integrated circuit in memory devices, having adjacent channel potentials Vch1 and Vch2 approximately equalized according to various exemplary embodiments of the present invention. FIG. 2 is a block diagram of a flash memory device including peripheral circuitry according to an embodiment of the present invention.

Referring to FIGS. 1 and 2, a NAND cell unit 131 undergoing programming has various bias voltages Vpgm, Vpass, Vss sequentially applied to the control gates 10, 20, 30, 40, 50 and word lines WL<> of its memory cell transistors. The NAND cell unit 131 is formed in an integrated circuit and in a memory block (MB) within the memory cell array 130 in a flash memory device 100 (FIG. 2). The NAND cell unit 131 is formed on a semiconductor substrate 100-1. The channel of the NAND cell unit 131 is formed in the semiconductor substrate 100-1 between the selection transistors SST and GST. In this exemplary embodiment, each of the memory cell transistors MC0 through MCn−1 has a control gate 11, 21, 31, 41, 51 and a floating gate 10, 20, 30, 40, 50 formed over the channel of the NAND cell unit 131 formed in the semiconductor substrate 100-1. The channel of the NAND cell unit 111 may be isolated from channels of other adjacent NAND cell units by shallow trench isolation (STI) (not shown), that prevents electrical current leakage between adjacent semiconductor device components.

A first (lower) local channel Ch1 having a first channel potential Vch1 is isolated from a second (upper) local channel Ch2 having second channel potential Vch2 by a memory cell transistor having a low voltage Vcutoff (Vss, 0V) applied to its control gate. The low voltage Vcutoff is applied to the control gate line of a memory cell transistor (e.g., WL<i −2>) which lies on the common source line CSL side of the selected memory cell transistor (WL<i >) so as to cut off the memory cell transistor (e.g., WL<i −2>). As an example, program voltage Vpgm is applied to the control gate 40 of the selected memory cell transistor (WL<i>) and intermediate voltage Vpass is applied to the control gates (e.g., 10, 30, 50) of non-selected memory cell transistors (WL<1>, . . . WL<i −3>, WL<i −1>, WL<i +1>, WL<1+2> . . . WL<31>).

A program voltage Vpgm (e.g., 20 volts) is applied to the control gate line (WL<i>) of the selected memory cell transistor and low voltage Vcutoff (for example, Vss, 0V) which cuts off a memory cell transistor is applied to the control gate lines (e.g., WL<i −2>) of the memory cell transistor 20 that isolates (localizes) the first local channel Ch1 from the second local channel Ch2. Intermediate voltage Vpass between Vpgm and Vcutoff (Vss) (e.g., 5 or 10 volts) is applied to the non-selected control gate lines (e.g., WL<i −3>, WL<i −1>, WL<1+1>). Each of the channel potentials Vch1 and Vch2 is induced by capacitative coupling of the voltages Vpgm, Vpass applied to control gates within the respective region. In particular, the second channel potential Vch2 is characterized by Equation 1:

$$Vch2 \propto \frac{q}{N} Vpass + \frac{1}{N} Vpgm \quad \text{[Equation 1]}$$

where q is the number of memory cell transistors having pass voltage Vpass applied to their control gates (e.g., 30, 50) within the second channel Ch2; and N is the total number of memory cells within the second channel Ch2. In accordance with equation 1, the nearer the selected memory cell transistor being programmed (Vpgm) is to the string selection line SSL, the smaller the total number N of memory cells within the second channel Ch2 becomes, and thus the second channel potential Vch2 becomes higher.

The potential difference Vch2 minus Vch1 between the channel potentials Vch1 and Vch2 of the two regions, first channel Ch1 and second channel Ch2, generates an electric field, and the hot carrier effect (HCE) may be increased, and soft-programming (program disturb) errors may take place due to the HCE. Thus, the nearer the selected memory cell transistor being programmed (Vpgm) is to the string selection line SSL, the more soft-programming (program disturb) errors due to HCE may occur. The hot carrier effect (HCE) soft-programming (program disturb) errors can occur when the difference (Vch2−Vch1) between the channel potentials Vch1 and Vch2 is greater than $V_{CHE}$, the critical voltage to generate the hot carrier effect (HCE). Thus, it is desirable to control the difference (Vch2−Vch1) between the channel potentials Vch1 and Vch2 in conformity with the condition expressed in equation 2:

$$Vch2-Vch1 < V_{CHE} \quad \text{[Equation 2]}$$

where $V_{CHE}$ is the critical voltage to generate Hot Carrier Effect (HCE) errors.

According to an exemplary embodiment of the present invention, a voltage alpha (α, as in Vcc−α, Vcc+α, further described below) is a value sufficient to bring Vch2 closer towards Vch1 enough to satisfy equation 2.

Referring to FIG. 2, a flash memory device 100 according to an exemplary embodiment of the present invention includes an array 130 of NAND cell units (NAND strings) 131, and peripheral circuitry including voltage supplier 110, X(row)-decoder 120, page buffer 140, control logic 150 and setup-data storage unit 160.

The memory cell array 130 comprises NAND cell units, word lines WL<>, and m bit lines BL<0> through BL<m-1>. The memory cell array 130 further includes a plurality m of bitlines BL<> (BL<0>, BL<1>, . . . BM<m-1>) connected to the string select transistors SST in the NAND cell units. The memory cell array 130 includes a plurality (c×n×m, where c is the number of NAND cell units in each column, and n is the number of wordlines/memory cell transistors in each NAND cell unit) of memory cell transistors MC<>.

The peripheral circuits 110, 120, 140, 150 and 160 cooperate to apply bias voltages to the NAND cell units 131 being programmed in the NAND cell array 130 that result in approximate equalization of adjacent local channel potentials Vch1 and Vch2 in the NAND cell units 131, and that prevent or minimizes hot carrier effect (HCE) soft-programming (program disturb) errors. During each programming operation upon designated word lines WL<> of the flash memory device 100 according to this exemplary embodiment of the invention, the voltage difference between adjacent local channel potentials Vch1 and Vch2 in the NAND cell units 131 may be reduced sufficiently to prevent hot carrier effect (HCE) soft-programming (program disturb) errors.

The voltage supplier 110 includes a string-select voltage (Vssl) generator 111, a program voltage (Vpgm) generator 112, and a pass voltage (Vpass) generator 113. The string-select voltage (Vssl) generator 111 is adapted to sequentially generate different string-select voltages (Vssl), e.g., Vcc, Vcc+α, and Vcc−α, to be applied to the string select lines (SSLs) and to the control gates of the string select transistors SST in the NAND cell units 131.

The program voltage (Vpgm) generator 112 and the pass voltage (Vpass) generator 113 generate bias voltages to be applied via the X(row)-decoder 120 and via the control lines (word lines WL<>) connected to the control gates of the selected memory cell transistors WL<i> and to non-selected memory cell transistors respectively, in the NAND cell units 131 in the array 130.

The X(row)-decoder 120 applies control voltages Vpgm, Vpass, Vss, Vssl generated by the voltage supplier 110 to word lines WL<0> to WL<n−1l> and select lines SSL, GSL in the array 130 based upon a received row address. According to the present embodiment of the invention, the X(row)-decoder 120 may provide control voltages Vpgm, Vpass, Vss, Vssl to the control lines during a programming operation in accordance with an erased area self-boost (EASB) system, to enable sequentially programming data on selected word lines WL<i> starting from the first word line WL<0> on the common source line CSL side of the NAND cell units 131 as described above. The program voltage Vpgm is applied to control gates of the selected memory cell transistors WL<i> while a low voltage Vcutoff (Vss) is applied to the control gates of the memory cell transistor WL<i −2> that lies on the common source line CSL side of the selected memory cell transistor WL<i>. The intermediate pass voltage Vpass is applied to the other (not WL<i −2>) unselected memory cell transistors. Thus, in every NAND cell unit 131 in the same memory block of the array 130, a first (lower) local channel Ch1 is formed on one side of the memory cell transistor WL<i−2> while a second (upper) local channel Ch2 is formed on other side of the memory cell transistor WL<i−2>, as is shown in FIG. 1.

The page buffer circuit 140 is connected to the NAND cell units 131 in memory cell array 130 via the plurality m of bit lines BL<0> to BL<m-1>. The page buffer circuit 140 writes received random data to the plurality m of bit lines BL<0>to BL<m-1> and reads random data stored in the NAND cell units 131 using the plurality m of bit lines BL<0> to BL<m-1>. The page buffer circuit 140 functions alternately as a write driver unit during the write (program) mode of operation and as a sense amplifier unit during the read mode of operation. During the write (program) mode of operation, the page buffer circuit 140 may conventionally supply a power supply voltage (Vcc) to the bit lines BL<> connected to memory cell transistors to be program-inhibited (written with "1" data) and connected to a first predetermined set of wordlines (e.g., WL<0>≦WL<i>≦WL<21>; x=22). In this case, injection of electrons is inhibited in the case of "1" data (so-called program inhibition, "1" programming or "1" write). During the write (program) mode of operation, the page buffer circuit 140 may supply a ground voltage (GND, 0V) to the bit lines BL<> connected to memory cell transistors to be programmed (written with "0" data). Thus, while writing random data into memory cell transistors, the page buffer circuit 140 controls the voltage developed across the floating gate of each memory cell transistor in the NAND cell unit 131 to be programmed according to its random data.

FIG. 3 shows a circuit diagram of the NAND cell unit 131 of FIG. 2, and a table of bias voltages (Vcc±α) applied to the string selection transistor SST therein during the write (program) mode of operation of the flash memory device 100 of FIG. 2.

Figure 4:
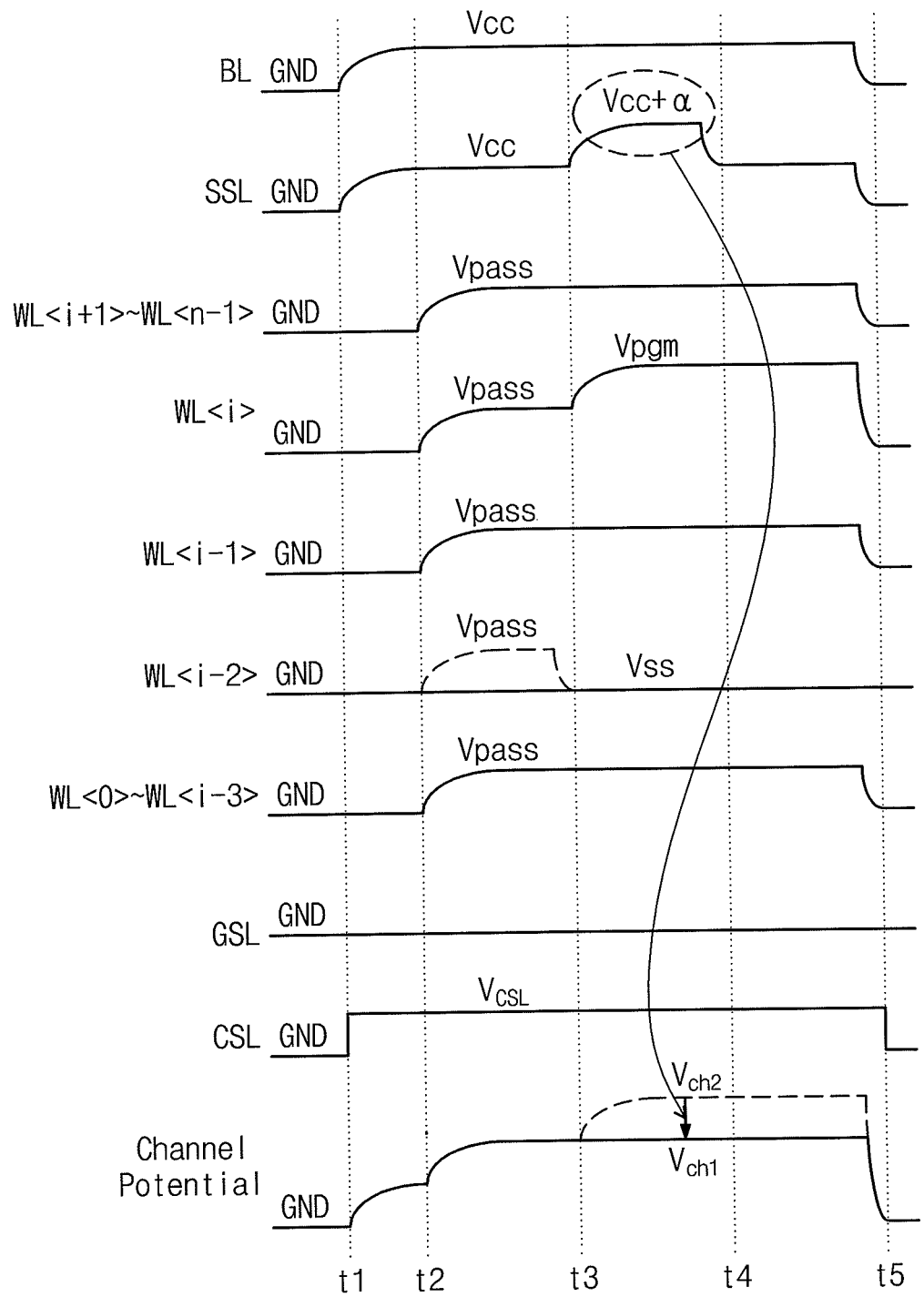
FIG. 4 is a timing diagram illustrating applying the Vcc+α bias voltage of FIG. 3 and the resulting equalization of the adjacent channel potentials Vch1 and Vch2 in the NAND cell unit 131 of FIG. 2.

FIG. 4 is a timing diagram illustrating applying the Vcc+α bias voltage of FIG. 3 to the string select lines (SSL) and to the control gates of the string select transistors SST in the NAND cell units 131 in the array 130 and the resulting equalization of the adjacent channel potentials Vch1 and Vch2 in the NAND cell units 131 of FIG. 2.

Figure 5:
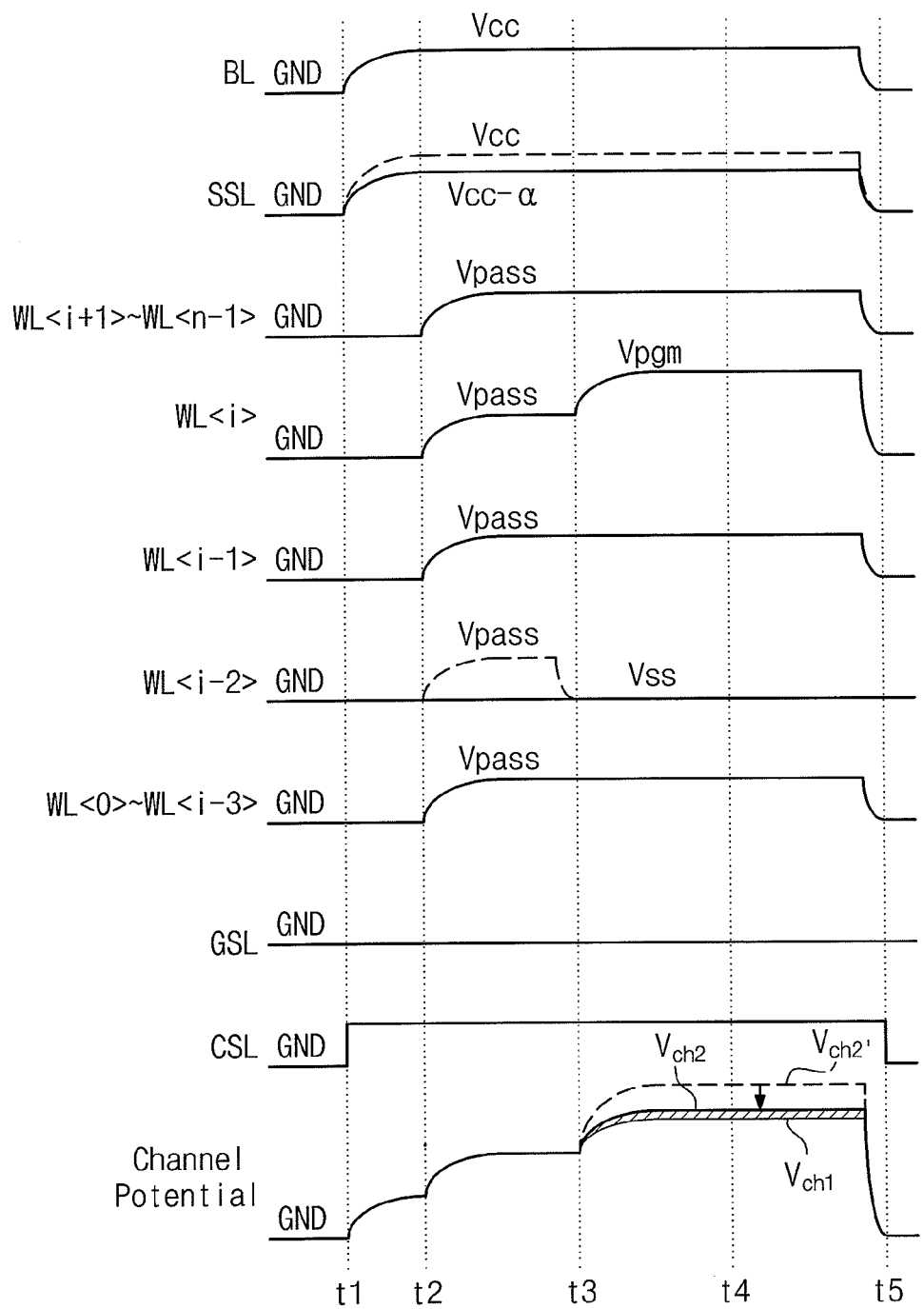
FIG. 5 is a timing diagram illustrating applying the Vcc−α bias voltage of FIG. 3 and the resulting approximate equalization of the adjacent channel potentials Vch1 and Vch2 in the NAND cell unit 131 of FIG. 2.

FIG. 5 is a timing diagram illustrating applying the Vcc−α bias voltage of FIG. 3 in accordance with an exemplary embodiment of the present invention and the resulting approximate equalization of the adjacent channel potentials Vch1 and Vch2 in the NAND cell unit 131 of FIG. 2.

Referring to FIGS. 3, 4 and 5, in accordance with an exemplary embodiment of the invention, during the write (program) mode of operation, the string-select voltage (Vssl) generator 111 generates predetermined string-select voltages (Vssl) to be sequentially applied to the string select lines (SSL) and to the control gates of the string select transistors SST in the NAND cell units 131 in the array 130. The channel potential (voltage) Vch2 is reduced by or during the application of predetermined string-select voltages (Vssl) to the string select lines (SSL) and to the control gates of the string select transistors SST in the NAND cell units 131 of FIG. 2.

Referring to FIG. 4, in a first exemplary method, the Vcc bias voltage and then the Vcc+α bias voltage is applied to the string select lines (SSL) and to the control gates of the string select transistors SST in the NAND cell units 131 in the array 130.

During a precharge period t1-t2, the string select lines (SSL) and the control gates of the string select transistors SST are raised to the voltage Vcc. The channel is precharged until the string select transistors SST are turned OFF (Vcc-Vth). The common source line (CSL) and the control gates of the ground select transistors GST are raised to $V_{CSL}$ while all the control gates of all memory cell transistors connected to all the wordlines WL<> are grounded. Consequently, the first channel's potential Vch1 and the second channel's potential Vch2 both rise slightly.

During a pre-programming period t2-t3, the control gates of all memory cell transistors connected to all the wordlines WL<> except wordline WL<I−2> are raised to the intermediate pass voltage Vpass. Consequently, the first channel's potential Vch1 and the second channel's potential Vch2 both rise due to capacitative coupling with the intermediate pass voltage Vpass.

During a programming period t3-t4, the string select lines (SSL) and the control gates of the string select transistors SST are pulse raised to the boosted voltage Vcc+α, and the control gates of the memory cell transistors connected to the wordline WL<i> are raised to the high program voltage Vpgm. The string select transistors SST are turned ON by the increased voltage, and the second channel's potential Vch2 is electrically connected to the bitline (Vcc). Because the boosted voltage Vcc+α is pulse applied to the string select lines (SSL) and to the control gates of the string select transistors SST during interval t3-t4, the second channel's potential Vch2 does not rise further during time interval t3-t5 despite capacitative coupling with high program voltage Vpgm on wordline WL<i>, and the result is approximate equalization of the adjacent channel potentials Vch1 and Vch2 in the NAND cell units 131 in FIG. 2.

Referring to FIG. 5, in an alternative method, only the Vcc−α bias voltage is applied to the string select lines (SSL) and to the control gates of the string select transistors SST in the NAND cell units 131 in the array 130.

During a precharge period t1-t2, the string select lines (SSL) and the control gates of the string select transistors SST are raised to the voltage Vcc−α (and maintained until time t5), and the common source line (CSL) and the control gates of the ground select transistors GST are raised to $V_{CSL}$ while all the control gates of all memory cell transistors connected to all the wordlines WL<> are grounded. Consequently, the first channel's potential Vch1 and the second channel's potential Vch2 both rise slightly.

During a pre-programming period t2-t3, the control gates of all memory cell transistors connected to all the wordlines WL<> except wordline WL<I−2> are raised to the intermediate pass voltage Vpass. The channel is precharged until the string select transistors SST are turned OFF by the voltage Vcc-Vth-α. The potential of the channel is relatively lower than in the case of string select transistors SST at voltage Vcc-Vth. Consequently, the first channel's potential Vch1 and the second channel's potential Vch2 both rise due to capacitative coupling with the intermediate pass voltage Vpass.

During a programming period t3-t4, the string select lines (SSL) and the control gates of the string select transistors SST remain at the voltage Vcc−α, and the control gates of the memory cell transistors connected to the wordline WL<i> are raised to the high program voltage Vpgm. The self-boosting of the second channel Ch2 is reduced by the relatively low precharge voltage Vcc−α during precharge period t2-t3. Because the voltage Vcc−α is applied to the string select lines (SSL) and to the control gates of the string select transistors SST during interval t2-t5, the second channel's potential Vch2 does not rise as much as it otherwise would rise during time interval t3-t5 due to capacitative coupling with high program voltage Vpgm on wordline WL<i>, and the result is approximate equalization of the adjacent channel potentials Vch1 and Vch2 in the NAND cell units 131 in FIG. 2. Thus, the difference (Vch2−Vch1) between the channel potentials Vch1 and Vch2 conforms with the condition expressed in equation 2.

Referring again to FIG. 2, the control logic 150 controls the string-select voltage (Vssl) generator 111 to sequentially output the different string-select voltages (Vssl) e.g., Vcc and then Vcc+α, according to a first method shown in FIG. 4, and Vcc and then Vcc−α, according to an alternative method shown in FIG. 5, to be applied to the string select lines (SSL) based on wordline information WL<x> stored in the setup data storage unit 260.

During the write (program) mode of operation, while programming on wordlines close to the bitline/SST end of the NAND cell unit (e.g., WL<22>≦<WL<i>≦WL<31>; x=22), the control logic 150 activates the string-select voltage (Vssl) generator 111 to sequentially output the different string-select voltages (Vssl) to the string select line SSL connected to string select transistors SST in the NAND cell units 131 to be programmed, to approximately equalize adjacent local channel potentials Vch1 and Vch2 in the NAND cell units 131. During the write (program) mode of operation, while programming on wordlines away from the bitline end of the NAND cell unit (e.g., WL<1>≦WL<i>≦WL<21>; x=22), the control logic 150 controls the string-select voltage (Vssl) generator 111 to not sequentially output different string-select voltage (Vssl) but to only supply a full power supply voltage (Vcc) to the string select line SSL connected to string select transistors SST in the NAND cell units 131 to be programmed.

Figure 17:
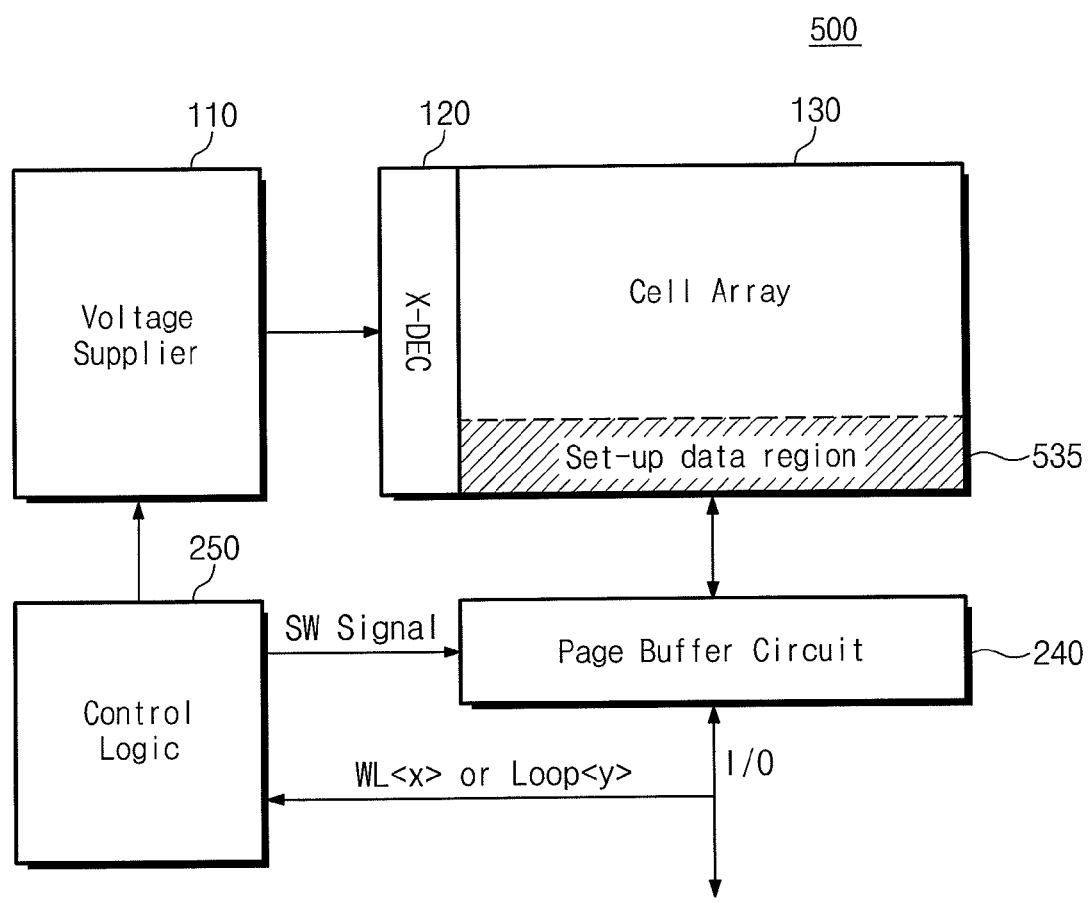
FIG. 17 is a block diagram of a flash memory device 500 including peripheral circuitry 110, 420, 140, 450 and 160 adapted to approximately equalize adjacent channel potentials Vch1 and Vch2 in the NAND cell unit 131 of FIG. 1 according to a fourth exemplary embodiment of the present invention.

The setup data storage unit 160 stores information identifying the word line(s) WL<x> (e.g., x=22) for which the hot carrier effect (HCE) soft-programming (program disturb) errors can conventionally occur, and sends that information x to the control logic 150 during power-on or at system initialization. Such information x identifying the word lines WL<x> can be estimated or experimentally measured and stored in the setup data storage unit 160 at a device test level. Alternatively, such information x may be stored in a specific region of the memory cell array 130 (setup data region 535, as shown in FIG. 17), and copied to the setup data storage unit 160 during power-on or at system initialization.

Figure 6:
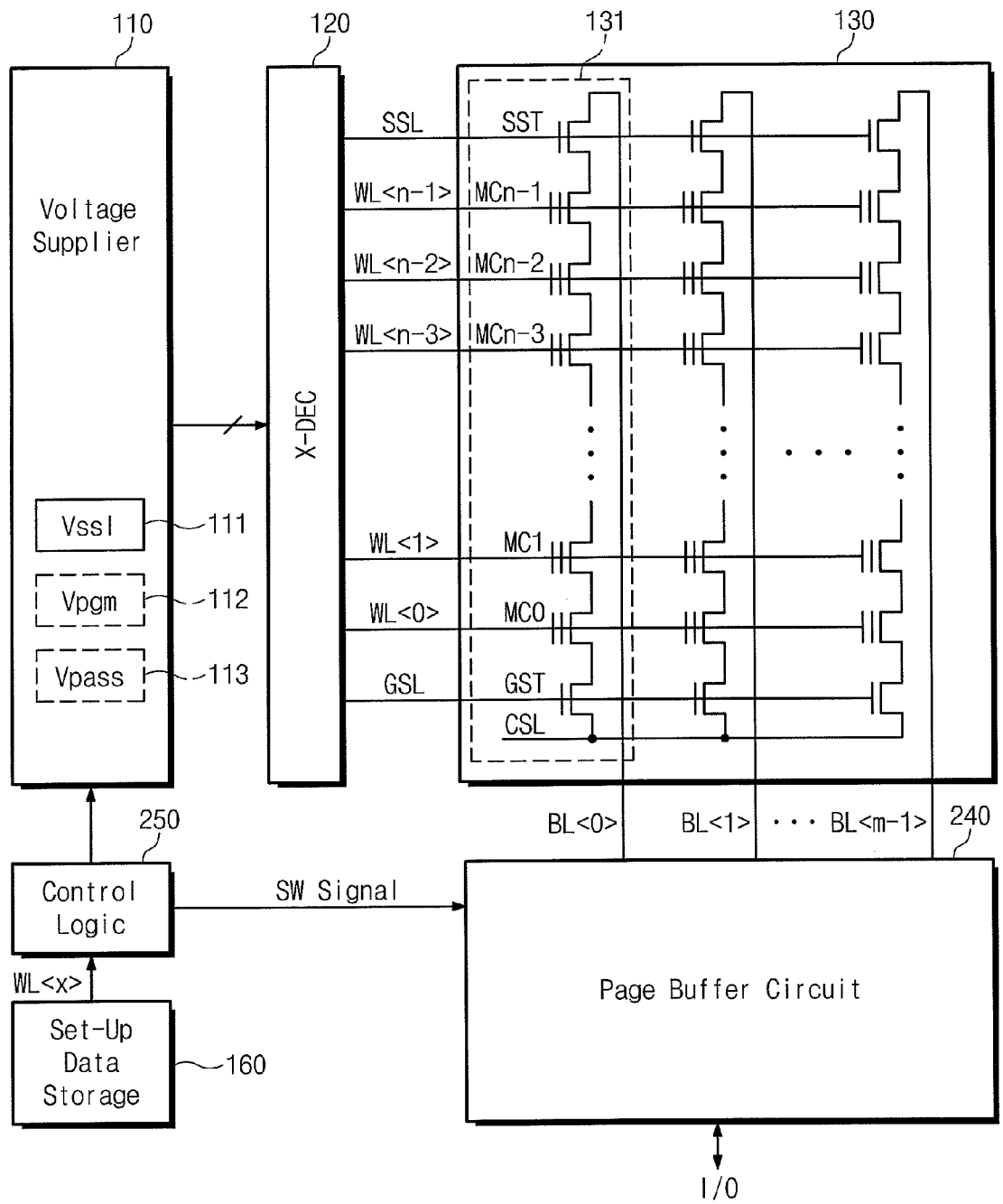
FIG. 6 is a block diagram of a flash memory device 200 including peripheral circuitry 110, 120, 240, 250 and 160 adapted to approximately equalize adjacent channel potentials Vch1 and Vch2 in the NAND cell unit 131 of FIG. 2.

FIG. 6 is a block diagram of a flash memory device 200 including peripheral circuitry 110, 120, 240, 250 and 160 adapted to approximately equalize adjacent local channel potentials Vch1 and Vch2 in the NAND cell unit 131 of FIG. 1 according to another exemplary embodiment of the present invention.

Referring to FIG. 6, a flash memory device 200 according to a second exemplary embodiment of the present invention includes an array 130 of NAND cell units (NAND strings) 131, and peripheral circuitry including voltage supplier 110, X(row)-decoder 120, page buffer 240, control logic 250 and setup-data storage unit 160.

The peripheral circuits 110, 120, 140, 150 and 160 cooperate to apply bias voltages and/or bitline voltages to the NAND cell units 131 being programmed in the NAND cell array 130 that result in approximate equalization of adjacent local channel potentials Vch1 and Vch2 in the NAND cell units 131, and that prevent or minimize hot carrier effect (HCE) soft-programming (program disturb) errors. During certain programming operations of the flash memory device 200 according to this exemplary embodiment of the invention, the voltage difference between adjacent local channel potentials Vch1 and Vch2 in the NAND cell units 131 may be reduced sufficiently to prevent hot carrier effect (HCE) soft-programming (program disturb) errors.

The voltage supplier 110 may include a string-select voltage (Vssl) generator 111 adapted to generate Vcc and Vcc−α as string-select voltages (Vssl) the same as the string-select voltage (Vssl) generator 111 in FIG. 2.

The page buffer circuit 240 is connected to the NAND cell units 131 in memory cell array 130 via the plurality m of bit lines BL<0> to BL<m-1>. The page buffer circuit 240 has the same read/write functions as the page buffer circuit 140 of FIG. 2, but is further adapted to output either a full bitline voltage Vcc or a reduced bitline voltage Vcc−α based upon the state of a switch signal SW from the control logic 250. During the write (program) mode of operation, the page buffer circuit 240 writes received random data to the plurality m of bit lines BL<0> to BL<m-1>. During the write (program) mode of operation with a first predetermined set of wordlines (e.g., WL<0>≦WL<i>≦WL<21>), the page buffer circuit 240 may conventionally supply a full power supply voltage (Vcc) to the bit lines BL<> connected to memory cell transistors to be program-inhibited (written with "1" data). During the write (program) mode of operation with a second predetermined set of wordlines (e.g., WL<22>≦WL<i>≦WL<31>), the page buffer circuit 240 may supply a reduced power supply voltage (Vcc−α) to the bit lines BL<> connected to memory cell transistors to be program-inhibited (written with "1" data). Thus, while writing random data into memory cell transistors, the page buffer circuit 240 controls the voltage developed across the floating gate of each memory cell transistor in the NAND cell unit 131 to be programmed according to its random data.

Figure 7A:
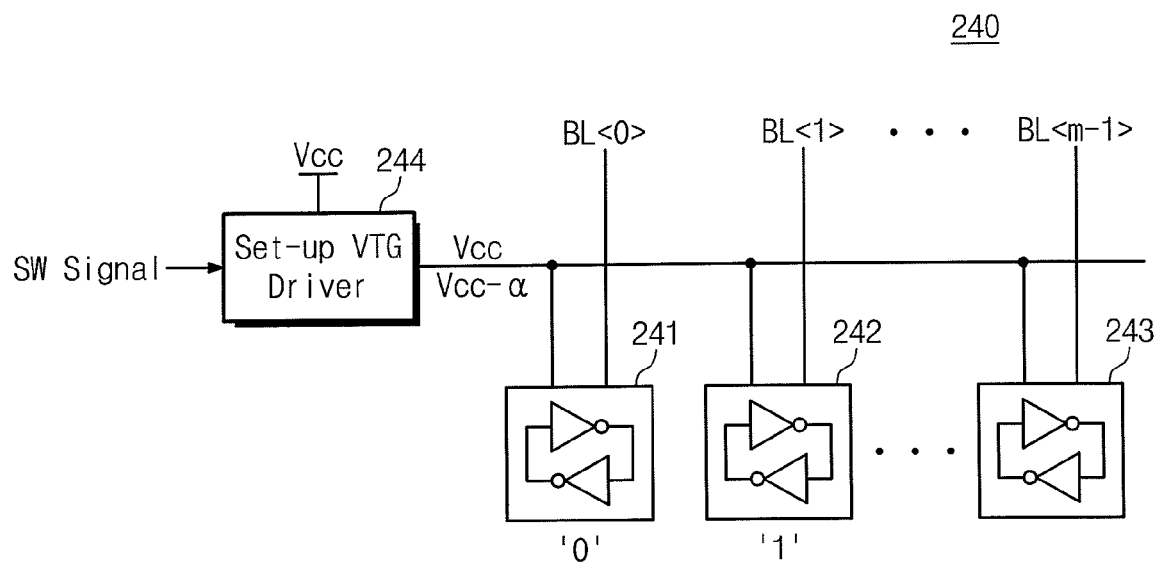
FIGS. 7a and 7b are block diagrams of circuits implementing the page buffer circuit 240 in the flash memory device 200 of FIG. 6.
Figure 7B:
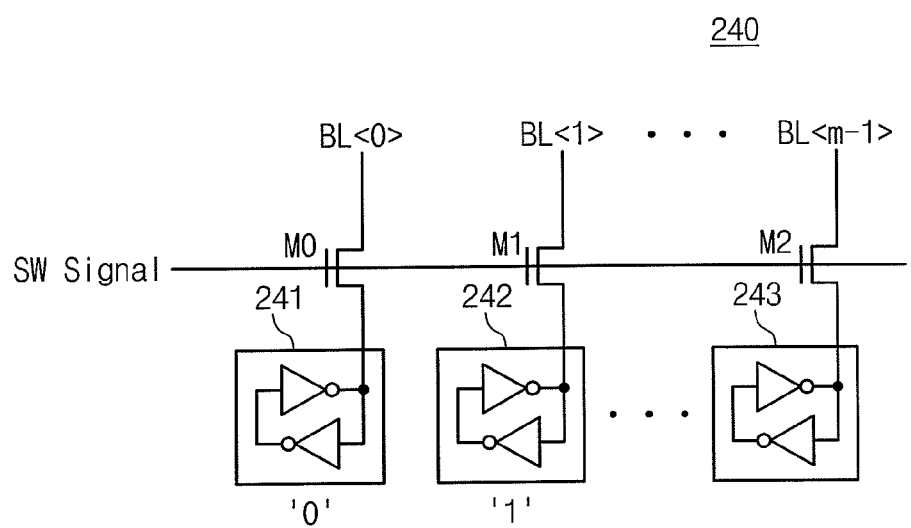

FIGS. 7a and 7b are block diagrams of circuits implementing the page buffer circuit 240 in the flash memory device 200 of FIG. 6. If the SW signal is activated by the control logic 250, e.g., during programming of the wordlines greater than WL<x> indicated by the stored contents of the set-up data storage unit 160, the set-up VTG driver 244 may supply reduced voltage Vcc−α as a supply voltage to the m latches 241, 242, 243 ... of the page buffer circuit 240. Each of the m latches 241, 242, 243 will output either a logic low voltage or a logic high voltage to its respective one of the m bitlines, depending on a bit of random binary data stored in each latch. Each one of the m bitlines BL<0> to BL<m-1> may be directly connected to an output node of a respective one of the m latches 241, 242, 243, as shown in FIG. 7b. While the reduced voltage Vcc−α is the supply voltage, the latches 241, 242, 243, latching "1" data will output the power supply voltage Vcc−α to its connected bitline. Conversely, while the full voltage Vcc is the supply voltage, the latches 241, 242, 243, latching "1" data will output the full supply voltage Vcc to its connected bitline. In some embodiments, as shown in FIG. 7b, the full power supply voltage (Vcc) output by the latches 241, 242, 243 to the m bitlines may be reduced (down to Vcc−α) through a resistance provided by transistors M0, M1, ... M2 whose resistance value is controlled by the switch signal SW from the control logic 250.

Figure 8:
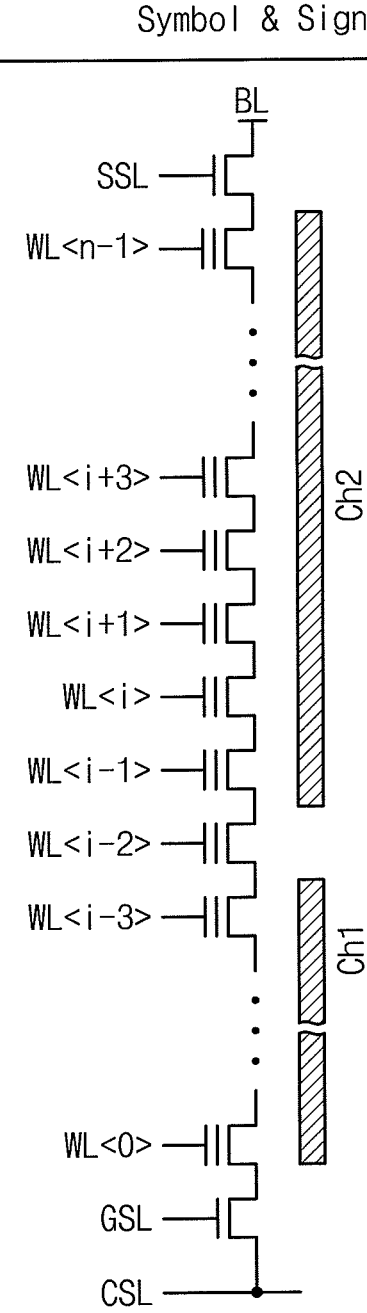
FIG. 8 is a combination circuit diagram of the NAND cell unit 131 of FIG. 6, and a table of bias voltages applied therein in the flash memory device 200 of FIG. 6.

FIG. 8 shows a circuit diagram of the NAND cell unit 131 of FIG. 6, and a table of bias voltages applied therein during the write (program) mode of operation of the flash memory device 100 of FIG. 6. During the write (program) mode of operation of the flash memory device 100 of FIG. 6, while wordlines equal to or greater than WL<x> are being programmed, the voltage Vcc−α may be applied to the bitlines and/or the string select lines SSL connected to the NAND cell unit 131 being programmed.

Figure 9:
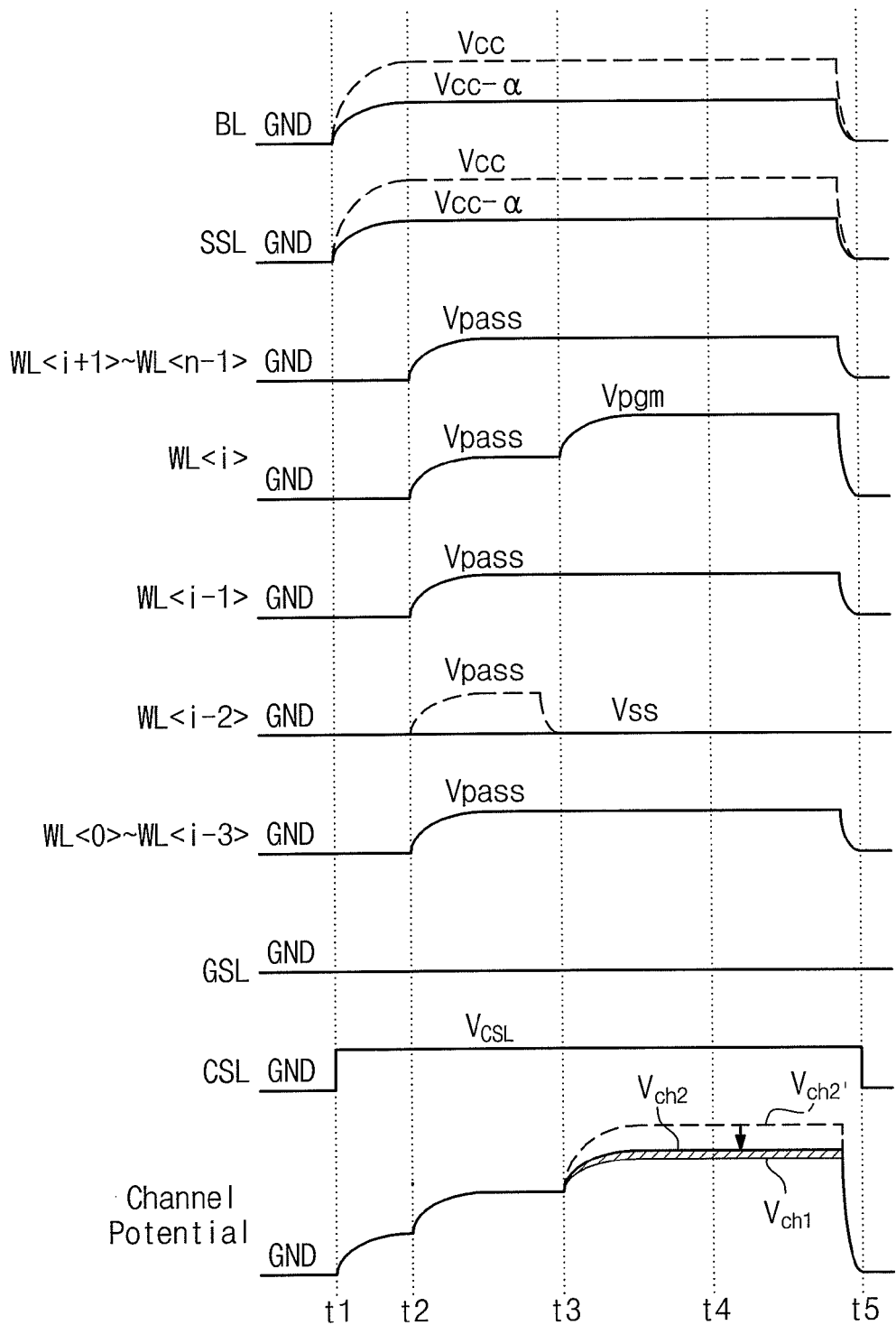
FIG. 9 is a timing diagram illustrating applying the Vcc−α bias voltage to bitlines and/or string select lines as shown in FIG. 8 and the resulting approximate equalization of the adjacent channel potentials Vch1 and Vch2 in the NAND cell unit 131 in the flash memory device 200 of FIG. 6.

FIG. 9 is a timing diagram illustrating application of the Vcc−α bias voltage to bitlines and/or string select lines as shown in FIG. 8, and to the string select lines (SSL) and/or to the bit lines BL<> connected to the NAND cell units 131 in the array 130. FIG. 9 shows the resulting approximate equalization of the adjacent channel potentials Vch1 and Vch2 in the NAND cell units 131 of FIG. 6.

Referring to FIGS. 8, and 9, in accordance with the another exemplary embodiment of the invention, during the write (program) mode of operation, while wordlines equal to or greater than WL<x> (e.g., WL<22>≦WL<i>≦WL<31>; x=22) are being programmed, the string-select voltage (Vssl) generator 111 generates predetermined reduced string-select voltage (Vssl) to be applied to the string select lines (SSL) and to the control gates of the string select transistors SST in the NAND cell units 131 in the array 130. At the same time, the page buffer circuit 240 supplies a reduced power supply voltage (Vcc−α) to the bit lines BL<> connected to memory cell transistors to be program-inhibited (written with "1" data).

The second channel potential (voltage) Vch2 is reduced by or during the application of reduced string-select voltage (Vssl) (Vcc−α) to the string select lines (SSL) and/or the application of a reduced power supply voltage (Vcc−α) to the bit lines BL<>.

During a precharge period t1-t2, the string select lines (SSL) and the bit lines BL<> connected to memory cell transistors to be program-inhibited are raised to the voltage Vcc−α (and maintained there until time t5) and the common source line (CSL) and the control gates of the ground select transistors GST are raised to $V_{CSL}$ while all the control gates of all memory cell transistors connected to all the wordlines WL<> are grounded. Consequently, the first channel's potential Vch1 and the second channel's potential Vch2 both rise slightly.

During a programming period t3-t4, the control gates of the memory cell transistors connected to the wordline WL<i> are raised to the high program voltage Vpgm. Because the voltage Vcc−α is pulse applied to the string select lines (SSL) and to the control gates of the string select transistors SST during interval t3-t4, and because the bit lines BL<> connected to memory cell transistors to be program-inhibited are raised to the voltage Vcc−α, the second channel's potential Vch2 does not rise as much as it otherwise would rise during time interval t3-t5 due to capacitative coupling with high program voltage Vpgm on wordline WL<i>, and the result is approximate equalization of the adjacent channel potentials Vch1 and Vch2 in the NAND cell units 131 in FIG. 6. Thus, the difference (Vch2−Vch1) between the channel potentials Vch1 and Vch2 in the NAND cell units 131 in FIG. 6 conform with the condition expressed in equation 2.

Figure 10:
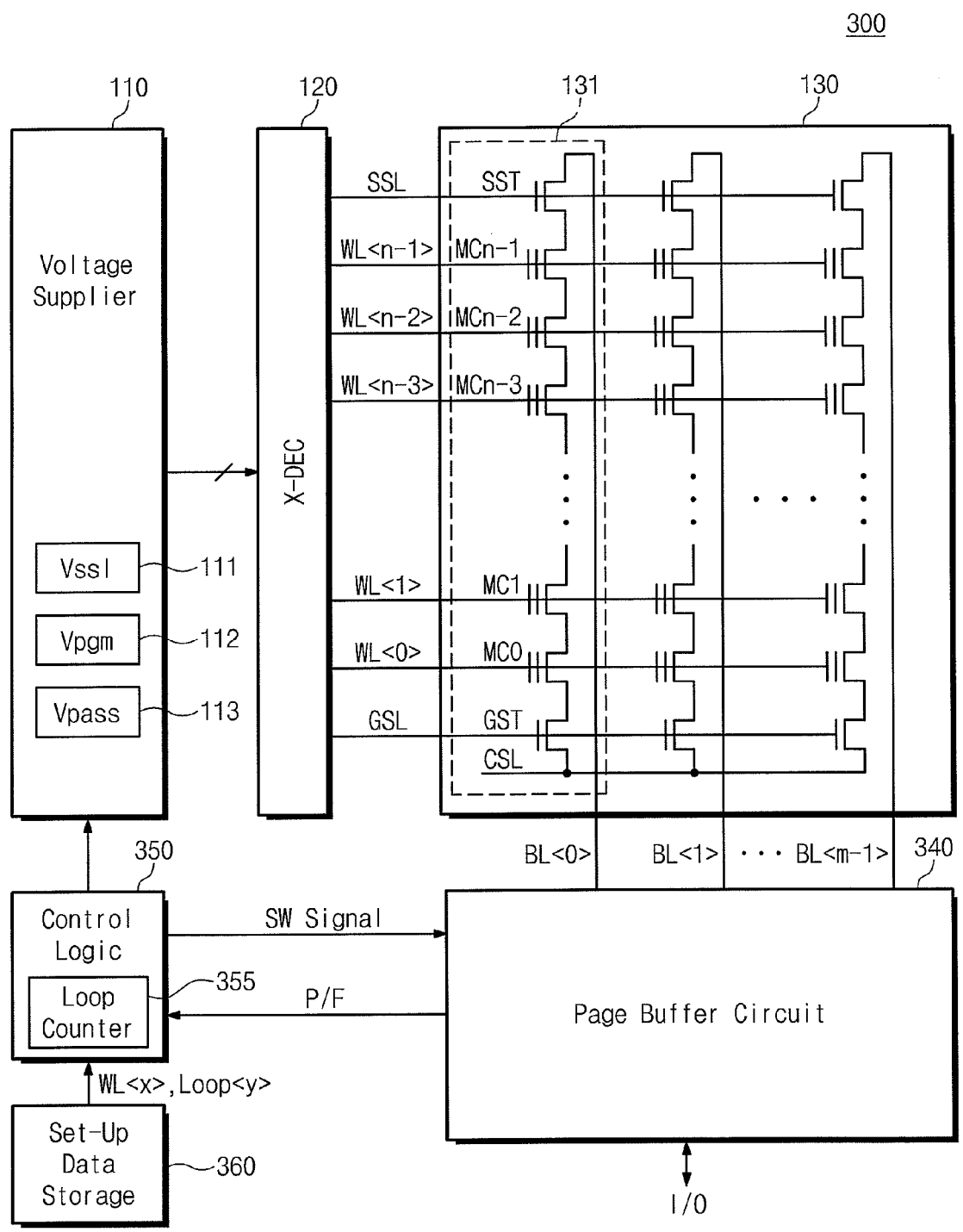
FIG. 10 is a block diagram of a flash memory device 300 including peripheral circuitry 110, 120, 340, 350 and 360 adapted to approximately equalize adjacent channel potentials Vch1 and Vch2 in the NAND cell unit 131 of FIG. 1 according to a third exemplary embodiment of the present invention.

FIG. 10 is a block diagram of a flash memory device 300 according to still another exemplary embodiment of the present invention, including peripheral circuitry 110, 120, 340, 350 and 360 adapted to substantially equalize adjacent channel potentials Vch1 and Vch2 in a NAND cell unit.

Referring to FIG. 10, a flash memory device 300 includes an array 130 of NAND cell units (NAND strings) 131, and peripheral circuitry including voltage supplier 110, X(row)-decoder 120, page buffer 340, control logic 350 and setup-data storage unit 360. The peripheral circuits 110, 120, 340, 350 and 360 cooperate to apply reduced bitline voltages to the NAND cell units 131 being programmed in the NAND cell array 130 to achieve approximate equalization of adjacent local channel potentials Vch1 and Vch2 in the NAND cell units 131, and to prevent or minimize hot carrier effect (HCE) soft-programming (program disturb) errors. During certain programming operations of the flash memory device 300, the voltage difference between adjacent local channel potentials Vch1 and Vch2 in the NAND cell units 131 may be reduced sufficiently to prevent hot carrier effect (HCE) soft-programming (program disturb) errors.

The control logic 350 includes a ISPP loop counter 355 and is adapted to support an incremental step pulse programming (ISPP) mode. While operating in the ISPP mode, a programming voltage Vpgm applied to a word line WL<> rises stepwise up during repetition of loops<j> of the programming cycle. The programming voltage Vpgm increases by a predetermined step increment (ΔV), also referred to as a "rising rate". The ISPP loop counter 355 counts each programming loop per wordline WL<i>. After the programming loops have been repeated for a particular wordline WL<i> a predetermined critical number y of times (i.e., when loop count j=y), the programming voltage Vpgm reaches a voltage level high enough to raise the second channel potential Vch2, according to equation 1, to a value high enough that the difference (Vch2−Vch1) between the channel potentials Vch1 and Vch2 in the NAND cell units 131 does not conform with the condition expressed in equation 2. Because the effect that Vpgm has upon boosting the channel potential Vch2 may depend upon the position of the wordline relative to the string selection transistor/bitline (see equation 1), the number y indicating the critical number of loops may depend upon the number of the current wordline WL<i>. Thus, the higher number i is, the lower the corresponding critical number y may be. The critical number y, e.g., y<i>, for each wordline WL<i>, e.g., for each wordline WL<i> equal to or greater than WL<x>, may be stored in the setup data storage unit 360.

The page buffer circuit 340 is connected to the NAND cell units 131 in memory cell array 130 via the plurality m of bit lines BL<0> to BL<m-1>. The page buffer circuit 340 has the same read/write functions as the page buffer circuit 340 of FIG. 2, but is further adapted to output either a full bitline voltage Vcc or a reduced bitline voltage Vcc−α based upon the state of a switch signal SW from the control logic 350. During the write (program) mode of operation, the page buffer circuit 340 writes received random data to the plurality m of bit lines BL<0> to BL<m-1>. During the write (program) mode of operation with a first predetermined set of wordlines (e.g., WL<0>≦WL<i>≦WL<21>; x=22), the page buffer circuit 340 may supply a full power supply voltage (Vcc) to the bit lines BL<> connected to memory cell transistors to be program-inhibited (written with "1" data). During the write (program) mode of operation with a second predetermined set of wordlines (e.g., WL<22>≦WL<i>≦WL<31>; x=22), the page buffer circuit 340 may supply a reduced power supply voltage (Vcc−α) to the bit lines BL<> connected to memory cell transistors to be program-inhibited (written with "1" data). Thus, while writing random data into memory cell transistors, the page buffer circuit 340 controls the voltage developed across the floating gate of each memory cell transistor in the NAND cell unit 131 to be programmed according to its random data. The page buffer circuit 340 in the flash memory device 200 of FIG. 10 may be implemented with the circuits shown the block diagrams of FIGS. 7a and 7b.

Figure 11:
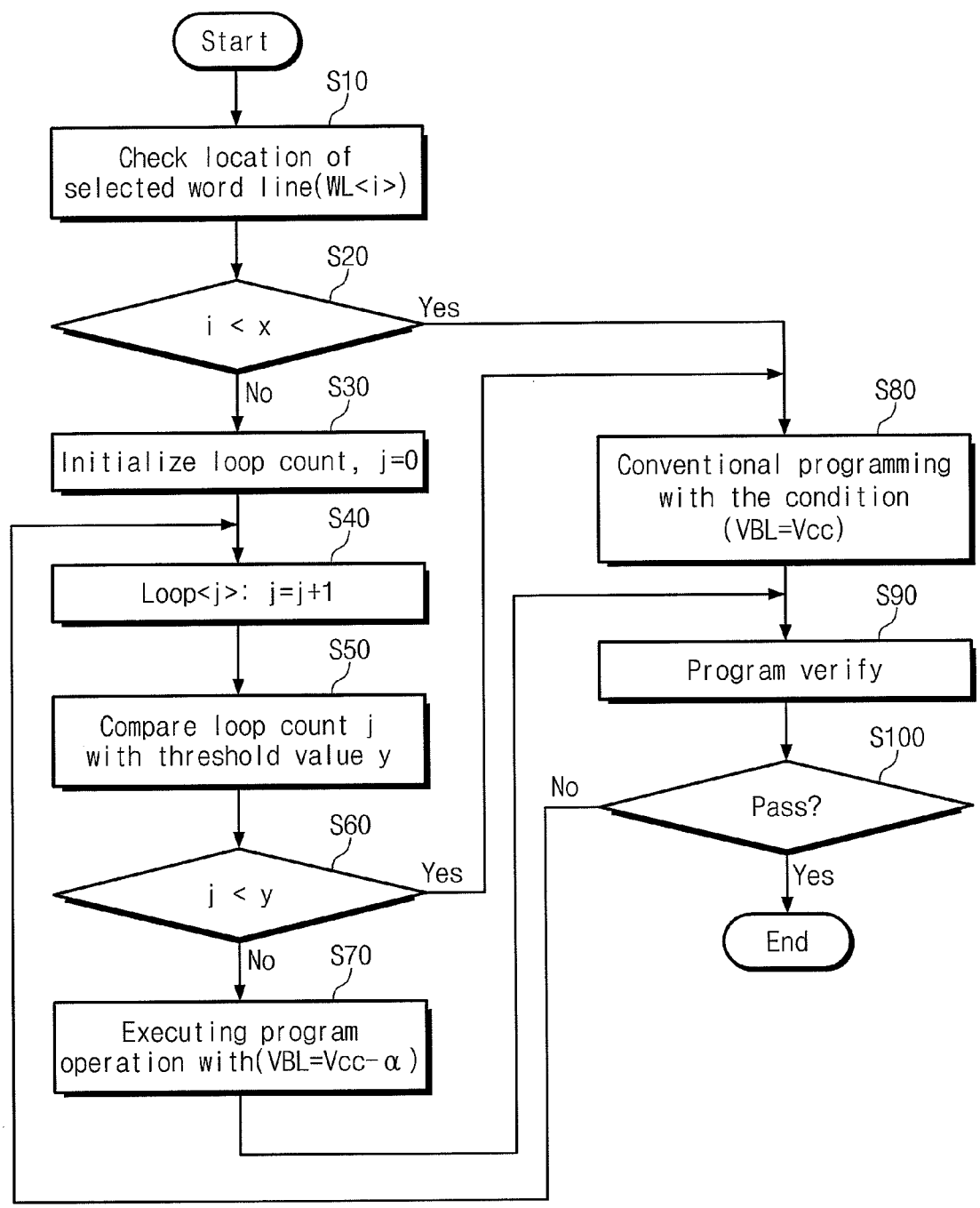
FIG. 11 is a flow chart of a method of selectively reducing the bitline voltage during incremental step pulse programming (ISPP) of predetermined pages (WL<i>) of the NAND cell units 131 in the flash memory device 300 of FIG. 10.

FIG. 11 shows exemplary method steps for selectively reducing the bitline voltage during incremental step pulse programming (ISPP) of predetermined pages (WL<i>) of the NAND cell units 131 in the flash memory device 300 of FIG. 10. FIG. 11 illustrates that during the write (program) mode of operation of the flash memory device 300 of FIG. 10, while the wordline WL<i> being programmed is equal to or greater than WL<x> (i.e., i≧x) and while the ISPP programming loop counter j equals or exceeds a critical number y (i.e., j≧y<i>), the reduced supply voltage Vcc−α is used as the bitline voltage VBL applied to the program-inhibit (data "1") bitlines BL<> connected to the NAND cell unit 131 being programmed in the flash memory device 300. FIG. 11 further illustrates that during the write (program) mode of operation of the flash memory device 300 of FIG. 10, if the number of the wordline WL<i> being programmed is less than the predetermined wordline WL<x> (i.e., i<x) or if the ISPP programming loop counter j is below the critical number y (i.e., j≧y<i>), then the full supply voltage Vcc is used as the bitline voltage VBL applied to the program-inhibit (data "1") bitlines BL<> connected to the NAND cell unit 131 being programmed in the flash memory device 300.

In decision/branch steps S10, S20, it is determined whether the number of the wordline WL<i> being programmed is or is not less than the predetermined wordline WL<x> (i.e., i<x). If number of the wordline WL<i> being programmed is less than the predetermined wordline WL<x> (i.e., i<x), (YES branch of S20) then conventional ISPP programming with the full bitline voltage (VBL=Vcc) is performed S80. If number of the wordline WL<i> being programmed is equal to or greater than the predetermined wordline WL<x> (i.e., i≧x), (NO branch of S20) then ISPP loop count a =0) initialization step S30 is performed, and then ISPP loop count j is incremented (j=j+1), and then decision/branch steps S50, S60 are performed.

In decision/branch steps S50, S60, it is determined whether the count number j of the current (jth) ISPP programming loop for wordline WL<i> (i.e., i<x) is or is not less than the predetermined critical loop number y. If ISPP loop count j of the wordline WL<i> being programmed is less than the predetermined critical loop number y, (YES branch of S60) then conventional ISPP programming with the full bitline voltage (VBL=Vcc) is performed S80.

When conventional programming with the bitline voltage VBL=Vcc is performed by ISPP S80 (e.g., following decisions S20 or S60), then verification/decision/branch steps S90, S100 are next performed in accordance with conventional ISPP programming methods. If the threshold voltage of the programmed memory cell transistors passes (YES branch of S100) verification S90, then ISPP programming of wordline WL<i> is complete at END.

If number of the wordline WL<i> being programmed is equal to or greater than the predetermined wordline WL<x> (i.e., i≧x), (NO branch of S20), and if loop count j of the wordline WL<i≧x> being programmed is equal to or greater than the predetermined critical loop number y, (NO branch of S60), THEN ISPP programming according to an exemplary embodiment of the invention with the reduced bitline voltage (VBL=Vcc−α) is performed (step S70).

Figure 12:
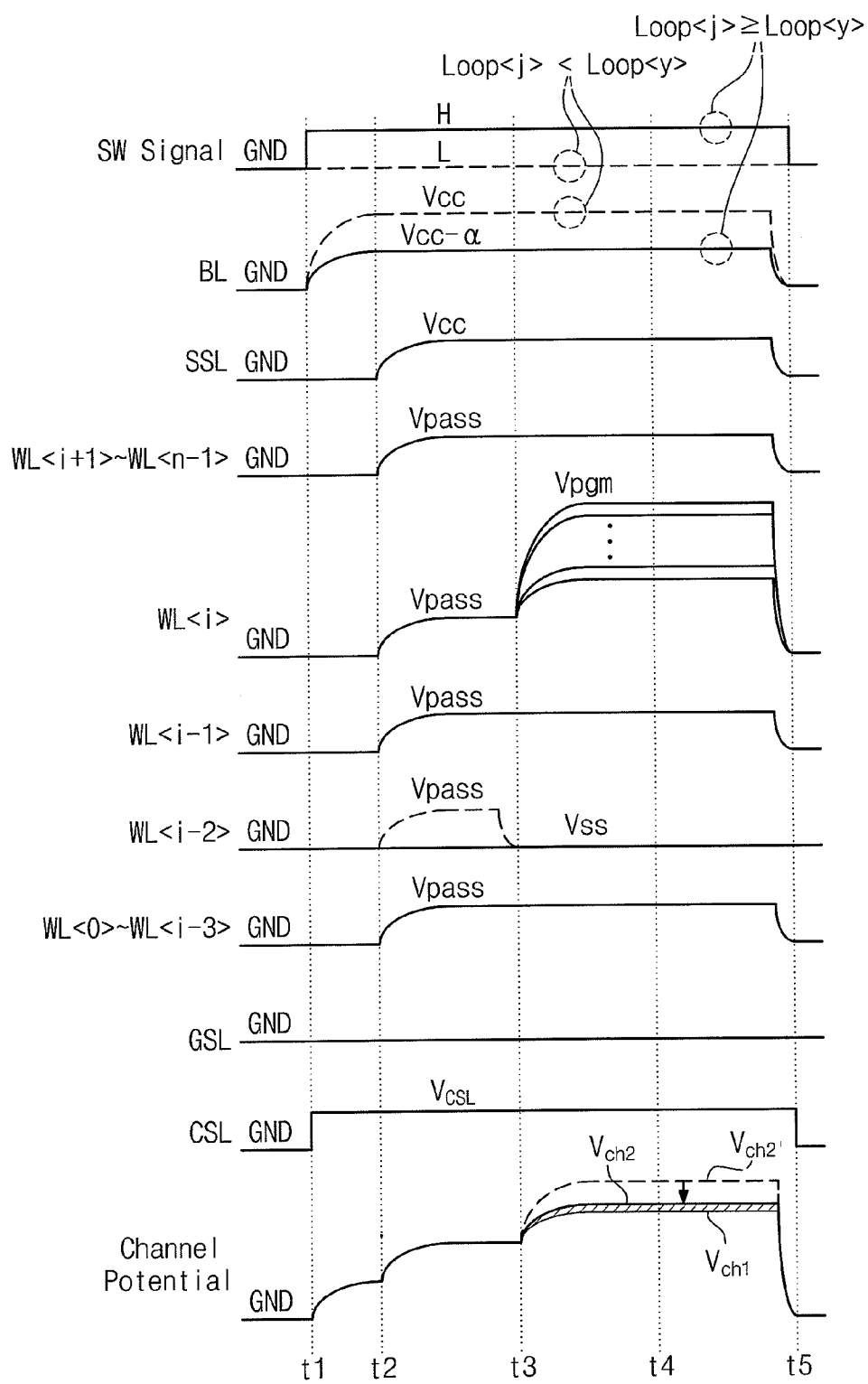
FIG. 12 is a timing diagram illustrating applying the Vcc−α bias voltage to the bitlines in FIG. 10 and the resulting approximate equalization of the adjacent channel potentials Vch1 and Vch2 in the NAND cell unit 131 in the flash memory device 300 of FIG. 10.

FIG. 12 is a timing diagram illustrating applying the Vcc−α bias voltage to the bitlines in FIG. 10 and the resulting approximate equalization of the adjacent channel potentials Vch1 and Vch2 in the NAND cell unit 131 in the flash memory device 300 of FIG. 10. During the write (program) mode of operation with a first predetermined set of wordlines (e.g., WL<0>≦WL<i>≦WL<21>; x=22), the control logic 350 inactivates the control signal SW (e.g., holding it to a logic low voltage L), and the page buffer circuit 340 supplies the full power supply voltage (Vcc) to the bit. lines BL<> connected to memory cell transistors to be program-inhibited (written with "1" data).

During the write (program) mode of operation with a second predetermined set of wordlines (e.g., WL<22>≦WL<i>≦WL<31>; x=22), and while the current ISPP program loop number <j> is less than a predetermined program loop number <y>, the control logic 350 inactivates the control signal SW (e.g., holding it to a logic low voltage L), and the page buffer circuit 340 supplies the full power supply voltage (Vcc) to the bit lines BL<> connected to memory cell transistors to be program-inhibited (written with "1" data). During the write (program) mode of operation with the second predetermined set of wordlines (e.g., WL<22>≦WL<i>≦WL<31>; x=22), and while the current ISPP program loop number <j> is equal to or greater than the predetermined program loop number <y>, the control logic 350 activates the control signal SW (e.g., raising it to a logic high voltage H), and the page buffer circuit 340 thereupon reduces the power supply voltage (Vcc−α) applied to the bit lines BL<> connected to memory cell transistors to be program-inhibited (written with "1" data).

The second channel potential (voltage) Vch2 is reduced by or during the application of the reduced power supply voltage (Vcc−α) to the bit lines BL<> connected to memory cell transistors to be program-inhibited (written with "1" data).

During a precharge period t1-t2, the string select lines (SSL) and the bit lines BL<> connected to memory cell transistors to be program-inhibited are raised to the voltage Vcc−α (and maintained there until time t5) and the common source line (CSL) and the control gates of the ground select transistors GST are raised to $V_{CSL}$ while all the control gates of all memory cell transistors connected to all the wordlines WL<> are grounded. Consequently, the first channel's potential Vch1 and the second channel's potential Vch2 both rise slightly.

During a programming period t3-t4, the control gates of the memory cell transistors connected to the wordline WL<i> are raised to the stepped program voltages Vpgm, depending on the ISPP loop<> number. Because the bit lines BL<> connected to memory cell transistors to be program-inhibited are raised to the voltage Vcc−α, the second channel's potential Vch2 does not rise as much as it otherwise would rise during time interval t3-t5 due to capacitative coupling with high program voltages Vpgm on wordline WL<i>, and the result is approximate equalization of the adjacent channel potentials Vch1 and Vch2 in the NAND cell units 131 in FIG. 10. The self-boosting of the second channel Ch2 is suppressed even while the program voltage Vpgm is increased over the voltage level provided for loop<y> and above. The (prior) self-boosted second channel potential Vch2' that would occur when the full supply voltage Vcc is supplied to the bitlines BL<> is reduced to a (new) second channel potential Vch2 because the reduced supply voltage Vcc−α is supplied to the bitlines BL<>. Thus, the difference (Vch2−Vch1) between the channel potentials Vch1 and Vch2 in the NAND cell units 131 in FIG. 10 conform with the condition expressed in equation 2 in the program-inhibited NAND cell units 131. Thus, in the program-inhibited NAND strings, hot carrier effect program disturb (soft programming) may be prevented by preventing the excessive potential increase of the second channel.

Figure 13:
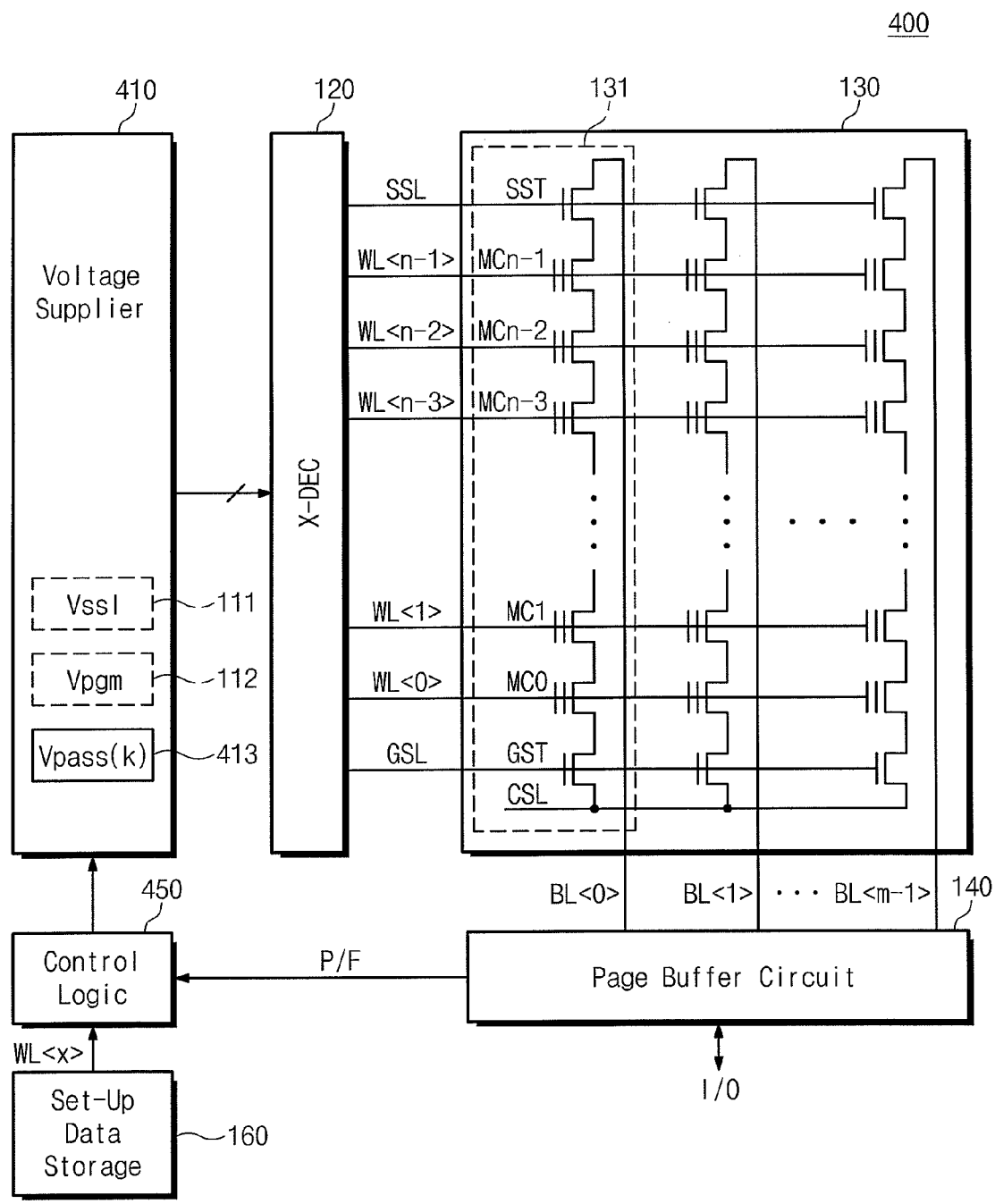
FIG. 13 is a block diagram of a flash memory device 400 including peripheral circuitry 110, 420, 140, 450 and 160 adapted to approximately equalize adjacent channel potentials Vch1 and Vch2 in the NAND cell unit 131 of FIG. 1 according to a fourth exemplary embodiment of the present invention.

FIG. 13 is a block diagram of a flash memory device 400 according to still another exemplary embodiment of the present invention, including peripheral circuitry 410, 420, 140, 450 and 160 adapted to approximately equalize adjacent local channel potentials Vch1 and Vch2 in the NAND cell unit 131 of FIG. 13

Referring to FIG. 13, a flash memory device 400 includes an array 130 of NAND cell units (NAND strings) 131, and peripheral circuitry including voltage supplier 410, X(row)-decoder 420, page buffer 140, control logic 450 and setup-data storage unit 160.

The memory cell array 130 comprises an array of NAND cell units, word lines WL<>, and m bit lines BL<0> through BL<m-1>. The peripheral circuits 410, 420, 140, 450 and 160 cooperate to apply bias voltages to the NAND cell units 131 being programmed in the NAND cell array 130 that result in approximate equalization of adjacent local channel potentials Vch1 and Vch2 in the NAND cell units 131, and that prevent hot carrier effect (HCE) soft-programming (program disturb) errors. During each programming operation upon designated word lines WL<> of the flash memory device 400, the voltage difference between adjacent local channel potentials Vch1 and Vch2 in the NAND cell units 131 may be reduced sufficiently to prevent hot carrier effect (HCE) soft-programming (program disturb) errors.

The voltage supplier 410 includes a string-select voltage (Vssl) generator 111, a program voltage (Vpgm) generator 112, and a multiple pass voltage Vpass(k) generator 413.

The multiple pass voltage Vpass(k) generator 413 generates a plurality k (k is an integer greater than 2) of intermediate bias voltages Vpass(k): Vpass(i+1) through Vpass(n−1) to be simultaneously applied via the X(row)-decoder 420 and via the control lines (word lines WL<i+1> through WL<n−1>) to the control gates of the unselected memory cell transistors MC<i+1> through MC<n−1> in the NAND cell units 131 in the array 130.

The X(row)-decoder 420 applies control voltages Vpgm, Vpass(k), Vss, Vssl generated by the voltage supplier 110 to word lines WL<0> to WL<n−1> and select lines SSL, GSL in the array 130 based upon a received row address. The multiple intermediate pass voltages Vpass(k) are simultaneously applied to the wordlines (other than WL<i −1>) of unselected memory cell transistors of the second channel Ch2 during programming of memory cell transistor MC<i>. Thus, in every NAND cell unit 131 in the same memory block of the array 130 of FIG. 13, the second channel Ch2 potential (Vch2) is affected by capacitative coupling with each of the k multiple intermediate pass voltages Vpass(k) applied to k word lines WL<I+1> through WL<n −1> and to the control gates of the unselected memory cell transistors MC<i+1> through MC<n −1>. Thus, in accordance with Equation 1, if the average voltage of the k multiple intermediate pass voltages Vpass(k) applied to unselected word lines is lower than the conventional pass voltage level Vpass, then a potential Vch2 of second channel Ch2 can be boosted that boosted if the conventional single pass voltage Vpass is applied to all of the k unselected word lines. And, further, as the selected word line WL<i> nears the string select line (SSL)/bitline end of the NAND cell unit 131, and the influence of the high program voltage Vpgm increases (see FIGS. 16*a* and 16*b*) the row decoder 420 may select and apply the lowest among the k multiple intermediate pass voltages Vpass(k) to the unselected word lines.

Control logic 450 controls the voltage supplier 410 so as to generate either the k multiple pass voltages Vpass(k) or a single pass voltage Vpass based upon whether the number i of the currently programmed word line WL<i> equals or exceeds the stored critical word line number x stored in setup data in the setup data storage unit 160. If a currently programmed word line WL<i> is between the critical word line WL<x> and a string select line SSL, the control logic 450 controls the voltage supplier 410 so as to supply two or more of the k multiple pass voltages Vpass(k) having various voltage levels to the unselected word lines via the X(row)-decoder 420, to prevent the second channel potential Vch2 from being excessively boosted. Thus, the difference (Vch2−Vch1) between the channel potentials Vch1 and Vch2 will conform with the condition expressed in equation 2.

FIG. 14 shows a circuit diagram of the NAND cell unit 131 of FIG. 13, and a table of bias voltages, e.g., k intermediate pass voltages Vpass(k) applied to the unselected word lines, therein during the write (program) mode of operation of the flash memory device 400 of FIG. 13.

Referring to FIG. 14, WL<i> denotes the selected word line currently being programmed. Word line WL<i−2> denotes the memory cell transistor that is turned OFF by the cutoff voltage (Vss) to isolate the first channel Ch1 from the second channel Ch2. Word lines WL<0> through WL<i−3> denote the unselected wordlines of the first channel Ch1, and the conventional intermediate pass voltage Vpass are applied to each of word lines WL<0> through WL<i−3>. Word lines WL<i−1> and WL<i+1> through WL<n−1> denote the unselected wordlines of the second channel Ch2 (closer to the string select line SSL). The k intermediate pass voltages Vpass(k) are applied to the unselected word lines WL<i+1> through WL<n−1>. The multiple pass voltages Vpass(i+1) to Vpass(n−1) applied to the unselected word lines WL<i+1> through WL<n−1 > have at least two different voltage levels.

A plurality of intermediate pass voltages Vpass(k): Vpass(i+1) to Vpass(n−1) applied to the unselected word lines WL<i+1> through WL<n−1> can be distributed in various ways, including (1) monotonically ascending-voltage order, (2) monotonically descending-voltage order, and (3) as a combination of conventional pass voltages Vpass supplied to one or more unselected word lines (e.g., WL(i+1)) adjacent to a selected word line WL<i> together with a plurality of intermediate pass voltages Vpass(k) applied to other unselected word lines. Regardless of the distribution of the plurality of intermediate pass voltages Vpass(k), the self-boosted voltage Vch2 of the second channel Ch2 when multiple pass voltages Vpass(i+1) to Vpass(n−1) are applied, is lower than if a single pass voltage Vpass is supplied to all the unselected word lines. Thus hot carrier effect program disturb (soft programming) errors may be prevented by applying a plurality of intermediate pass voltages Vpass(k) to prevent the excessive potential increase of the second channel.

Figure 15A:
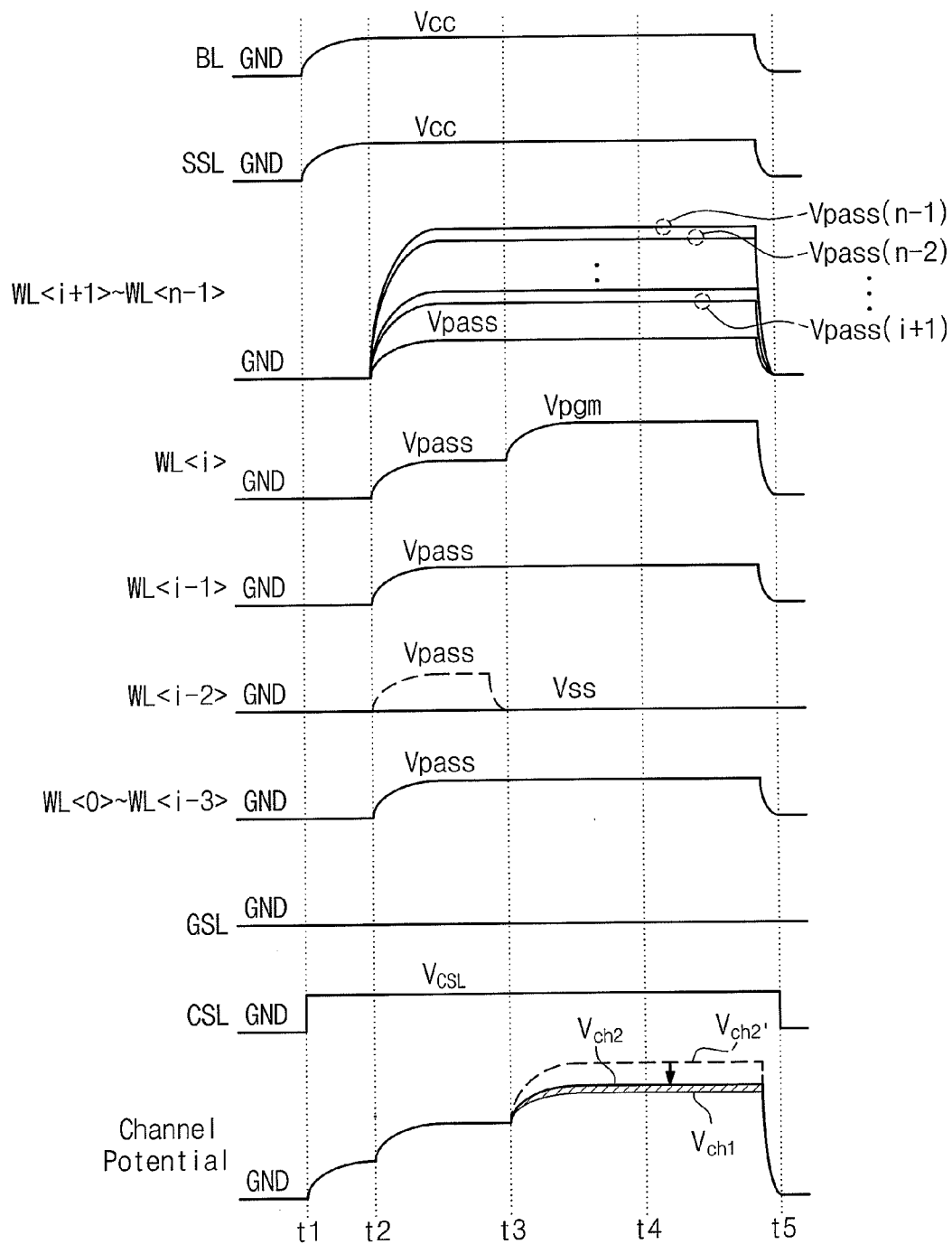
FIG. 15a is a timing diagram illustrating applying multiple intermediate pass voltages Vpass(k) in ascending-voltage order to the unselected wordlines WL<i+1> through WL<n−1> in the NAND cell unit 131 in the flash memory device 400 of FIG. 13.

FIG. 15*a* is a timing diagram illustrating applying multiple intermediate pass voltages Vpass(k) in ascending-voltage order to the unselected wordlines WL<i+1> through WL<n−1> of the second channel Ch2 in the NAND cell unit 131 in the flash memory device 400 of FIG. 13 and the resulting approximate equalization of the adjacent channel potentials Vch1 and Vch2.

Referring to FIGS. 13, 14 and 15*a*, 15*b*, and 15*c*, during the write (program) mode of operation, while wordlines equal to or greater than WL<x> (e.g., WL<22>≦WL<i>≦WL<31>; x=22) are being programmed, the multiple pass voltage Vpass (k) generator 413 simultaneously generates a plurality k (at least two) of different pass voltages to be applied to the WL<i+1> through WL<n−1> of the second channel Ch2 in the NAND cell unit 131 in the flash memory device 400 of FIG. 13.

In FIG. 15*a*, the multiple pass voltages Vpass(k) applied to the WL<i+1> through WL<n−1> are distributed in a monotonically increasing order. Thus, Vpass(i+1)<Vpass(i+2) <Vpass(i+3) . . . <Vpass(n−1). As a result, excessive self-boosting of the second channel Ch2 is suppressed even while the high program voltage Vpgm is applied to WL<i> during time t3-t5. The difference (Vch2−Vch1) between the channel potentials Vch1 and Vch2 conform with the condition expressed in equation 2. Thus hot carrier effect program disturb (soft programming) errors may be prevented by preventing the excessive potential increase of the second channel.

Figure 15B:
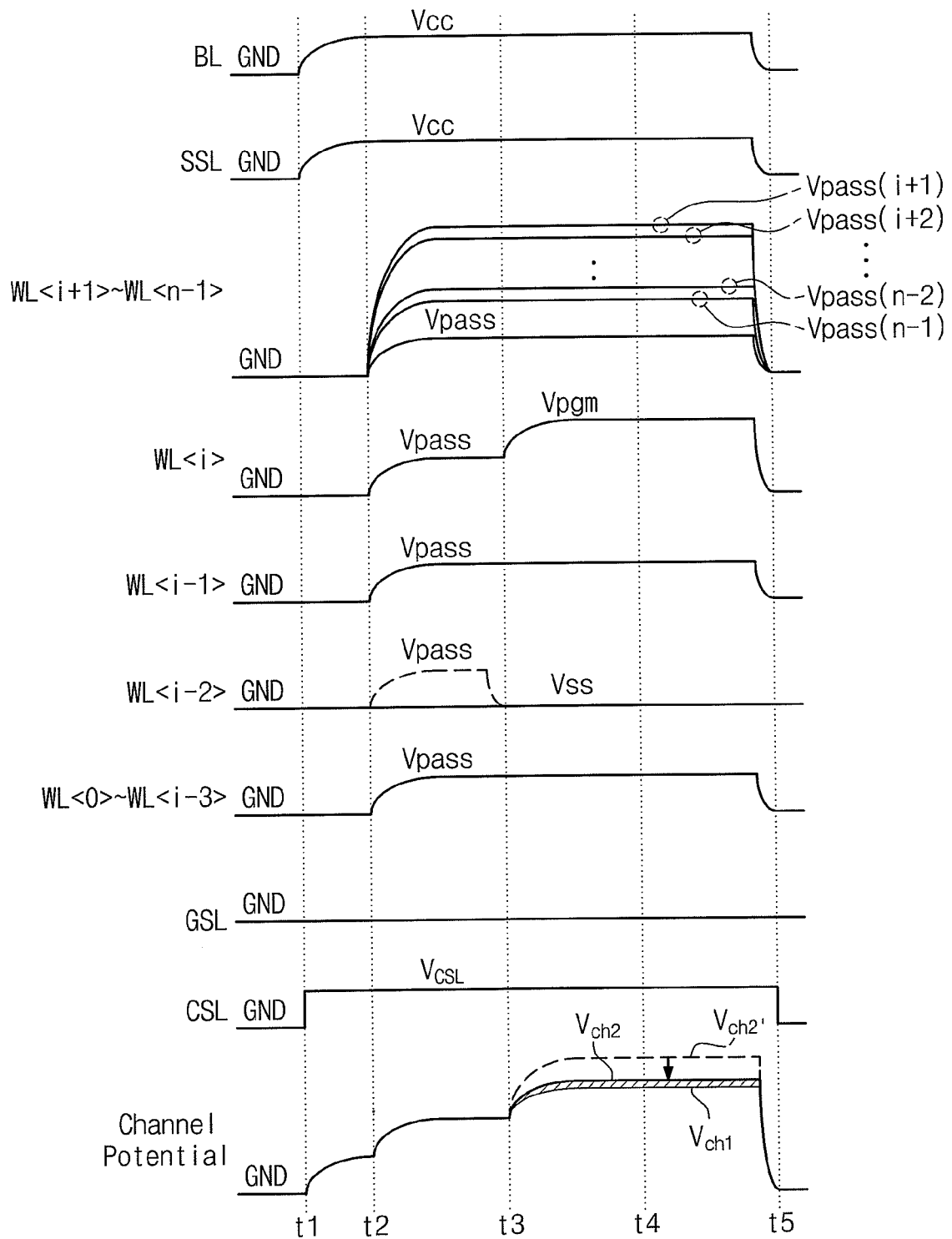
FIG. 15b is a timing diagram illustrating applying multiple (descending) intermediate pass voltages Vpass(k) in descending-voltage order to the unselected wordlines WL<i+1> through WL<n−1> in the NAND cell unit 131 in the flash memory device 400 of FIG. 13.

FIG. 15*b* is a timing diagram illustrating applying multiple (descending) intermediate pass voltages Vpass(k) in descending-voltage order to the unselected wordlines WL<i+1> through WL<n−1> in the NAND cell unit 131 in the flash memory device 400 of FIG. 13 and the resulting approximate equalization of the adjacent channel potentials Vch1 and Vch2.

In FIG. 15*b*, the multiple pass voltages Vpass(k) applied to the WL<i+1> through WL<n−1> are distributed in a monotonically decreasing order. Thus, Vpass(i+1)>Vpass(i+2)> Vpass(i+3) . . . >Vpass(n−1). As a result, excessive self-boosting of the second channel Ch2 is suppressed even while the high program voltage Vpgm is applied to WL<i> during time t3-t5. The difference (Vch2−Vch1) between the channel potentials Vch1 and Vch2 conform with the condition expressed in equation 2. Thus hot carrier effect program disturb (soft programming) errors may be prevented by preventing the excessive potential increase of the second channel.

Figure 15C:
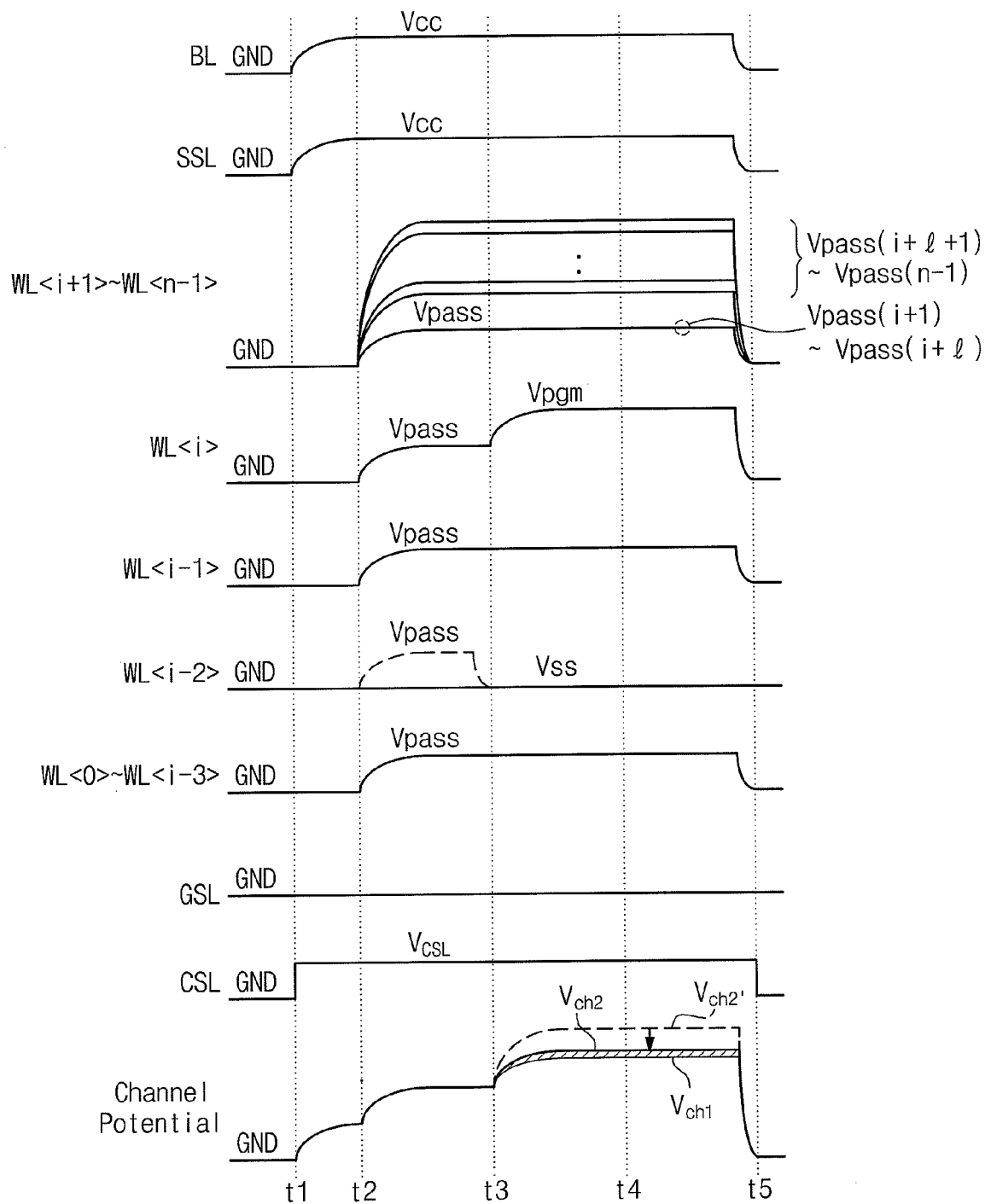
FIG. 15c is a timing diagram illustrating applying conventional pass voltage Vpass plus various multiple intermediate pass voltages Vpass(k) to the unselected wordlines WL<i+1> through WL<n−1> in the NAND cell unit 131 in the flash memory device 400 of FIG. 13.

FIG. 15*c* is a timing diagram illustrating applying conventional pass voltage Vpass plus various multiple intermediate pass voltages Vpass(k) to the unselected wordlines WL<i+1> through WL<n−1> in the NAND cell unit 131 in the flash memory device 400 of FIG. 13 and the resulting approximate equalization of the adjacent channel potentials Vch1 and Vch2. The multiple intermediate pass voltages Vpass(k) shown in FIGS. 15*a*, 15*b*, and 15*c* are not drawn to scale.

In FIG. 15*c*, the multiple pass voltages Vpass(k) and conventional pass voltages Vpass are distributed and applied to the wordlines WL<i+1> through WL<n−1>. Thus, Vpass(i+1)=Vpass(i+2)= . . . Vpass(l+/), while Vpass(I+/)<Vpass(n−3)<Vpass(n−2)<Vpass(n−1). This prevents the selected word line WL<i> from being adjacent to a relatively low-voltage pass voltage. As a result, excessive self-boosting of the second channel Ch2 is suppressed even while the high program voltage Vpgm is applied to WL<i> during time t3-t5. The difference (Vch2−Vch1) between the channel potentials Vch1 and Vch2 conform with the condition expressed in equation 2. Thus hot carrier effect program disturb (soft programming) errors may be prevented by preventing the excessive potential increase of the second channel.

Figure 16A:
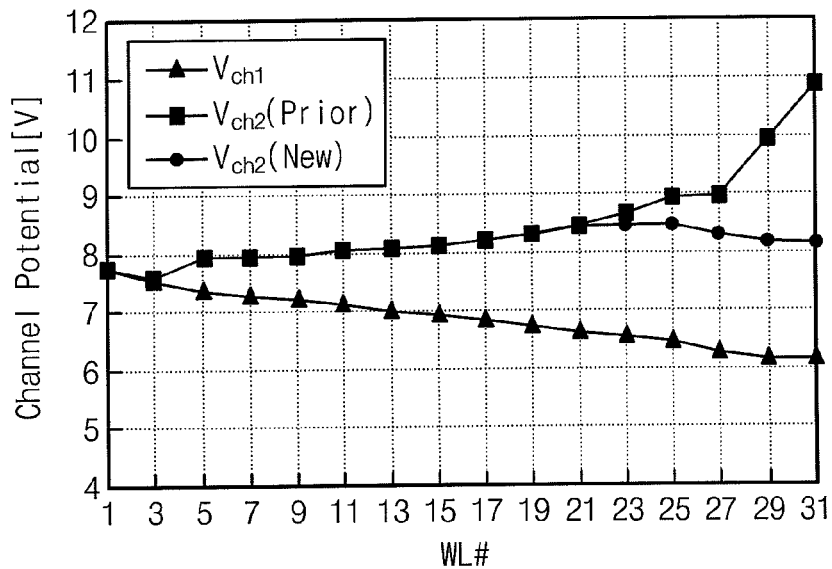
FIG. 16a and 16b are graphs of experimentally obtained data for comparing the channel potentials Vch2(prior) developed in a conventional NAND flash memory device with the channel potentials Vch2(new) developed in the NAND flash memory devices 100, 200, 300, 400, or 500 of FIGS. 2, 6, 10, 13, or 17, while programming 1-bit (binary) data in all pages (WL<1> through WL<31>) of the NAND cell units 131.
Figure 16B:
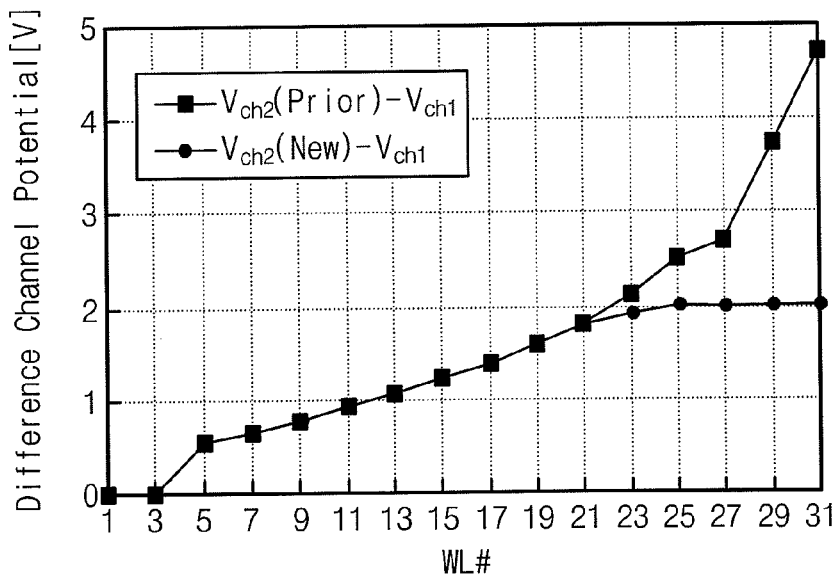

FIGS. 16*a* and 16*b* depict data relating to channel potentials Vch1 and Vch2. FIG. 16*a* plots the channel potentials (Vch1 ▲, Vch2 (prior) ■) conventionally developed in a NAND cell unit 131 in a flash memory device when sequentially programming 1-bit (binary) data in all pages (e.g., WL<1> through WL<31>). FIG. 16*b* plots the difference ■ (Vch1−Vch2(prior)) between the channel potentials (Vch1 ▲, Vch2(prior) ■) developed in a NAND cell unit 131 in a flash memory device when sequentially programming 1-bit (binary) data in all pages (e.g., WL<1> through WL<31>). As shown in FIGS. 16*a* and 16*b* the difference ■ (Vch1−Vch2 (prior)) between the channel potentials (Vch1 ▲, Vch2(prior) ■) developed in a NAND cell unit 131 in a flash memory device sharply increases as programming is performed in the pages (e.g., WL<23> through WL<31>) closest to the string select line (SSL) and bit lines, where the value of number N in equation 1 becomes increasingly smaller. Thus, hot carrier effect (HCE) soft-programming (program disturb) errors are more likely to occur in a flash memory device during programming in the pages (e.g., WL<23> through WL<31 >) closest to the string select line (SSL) and bit lines.

FIG. 16*a* additionally depicts the channel potentials (Vch1 ▲, Vch2(New) ●) developed in a NAND cell unit 131 in flash memory devices according to exemplary embodiments of the present invention when sequentially programming 1-bit (binary) data in all pages (e.g., WL<1> through WL<31>). FIG. 16*b* additionally depicts the difference ● (Vch1−Vch2 (New)) between the channel potentials (Vch1 ▲A, Vch2 (New) ●) developed in a NAND cell unit 131 in flash memory devices according to exemplary embodiments of the present invention when sequentially programming 1-bit (binary) data in all pages (e.g., WL<1> through WL<31>). As shown in FIG. 16*b* the difference ● (Vch1−Vch2(New)) between the channel potentials (Vch1 ▲, Vch2(New) ●) developed in a NAND cell unit 131 in flash memory devices according to exemplary embodiments of the present invention do not sharply increase in accordance with equation 1 during programming in the pages (e.g., WL<23> through WL<31>) closest to the string select line (SSL) and bit lines. Thus, hot carrier effect (HCE) soft-programming (program disturb) errors are less likely to occur during programming in the pages (e.g., WL<23> through WL<31>) closest to the string select line (SSL) and bit lines in a flash memory device according to an embodiment of the present invention.

FIG. 17 is a block diagram of a flash memory device 500 including peripheral circuitry 110, 120, 240, 250 adapted to substantially equalize adjacent channel potentials Vch1 and Vch2 in the NAND cell unit 131 of FIG. 1 according to another exemplary embodiment of the present invention. The memory device 500 may be the same as memory device 200 of FIG. 2 or other exemplary embodiments disclosed hereinabove except that memory device 500 is implemented without the distinct setup-data storage unit 160. The setup-data storage functions of the setup-data storage unit 160 of FIG. 2 have been implemented in FIG. 17 using a dedicated setup-data region 535 of the flash memory array 130 to store the setup-data (e.g., WL<x> or Lope<y>).

Figure 18:
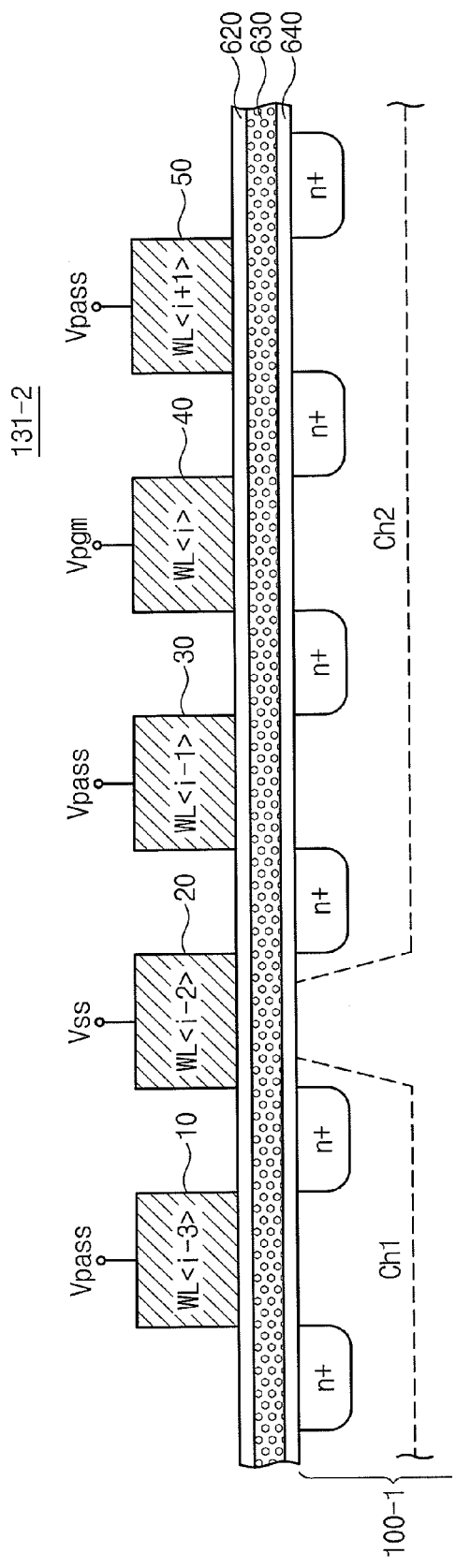
FIG. 18 is a side cross-sectional view of a charge-trap type NAND cell unit 131-2, formed in an integrated circuit for use in alternative embodiments of the memory devices (100, 200, 300, 400, or 500 in FIGS. 2, 6, 10, 13 and 17 respectively)

FIG. 18 is a cross-sectional view of a charge-trap type NAND cell unit 131-2, formed in an integrated circuit for use in alternative embodiments of the memory devices 100, 200, 300, 400, or 500 in FIGS. 2, 6, 10, 13 and 17, respectively.

An exemplary memory device includes polycrystalline silicon ("polysilicon", poly-Si) gates 10, 20, 30, 40, 50 formed over a dielectric layer that includes a silicon nitride layer 630 sandwiched between silicon oxide layers 620, 640, referred to as a SONOS (silicon-oxide-nitride-oxide-semiconductor). The charge storage medium may comprise blocking insulating layer 620, charge storage layer 630, and tunnel insulating layer 640. Descriptions of such charge storage medium is described in U.S. Pat. Nos. 6,85,8906, and 7,253, 467, and No. 20060180851 that are incorporated by reference herein.

A floating trap type non-volatile memory device uses trap levels, such as those found in a silicon nitride layer 630, for memory operations. When a positive voltage is applied on the gate electrode (e.g. 10), electrons are tunneled via the tunneling insulating layer 640 to become trapped in the charge storage layer 630. As the electrons are accumulated in the charge storage layer 630, a threshold voltage of the memory cell transistor is increased, and the memory device becomes programmed. Consequently, the threshold voltage of the unit memory device is decreased, and the memory device becomes erased.

Figure 19:
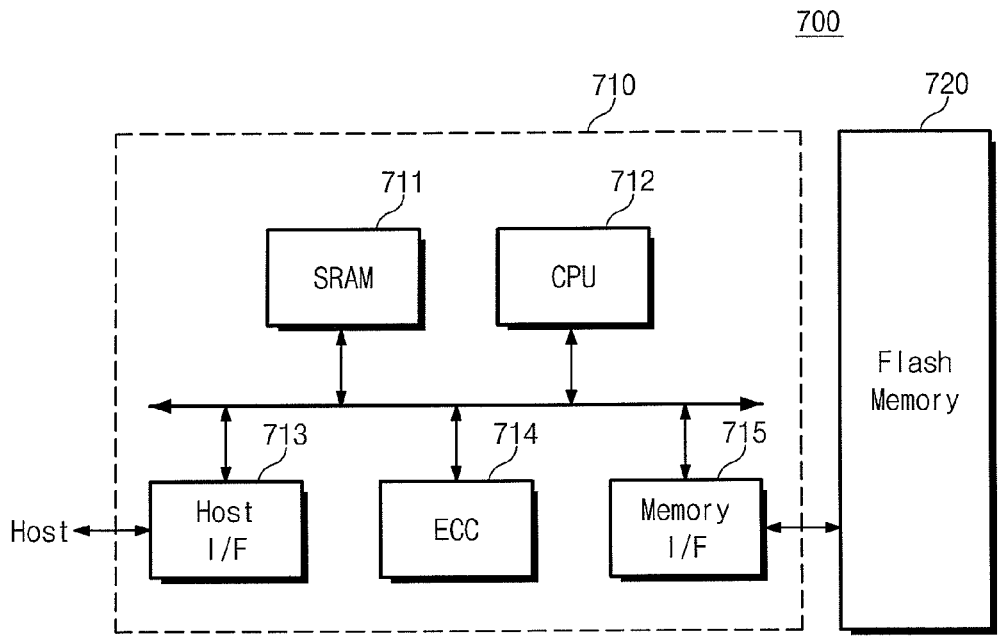
FIG. 19 is a block diagram of a memory card including a flash memory device 720 (e.g., 100, 700, 300, 400, 500) according to any embodiment of the present invention.

FIG. 19 is a block diagram of a memory card including a flash memory device 720 (e.g., 100, 700, 300, 400, 500) according to at least one embodiment of the present invention described above. The memory card 700 is connected to a Host and receives small block based logical addresses and user data from the host. The memory card 700 includes a host interface 713, a memory controller/interface 715, a flash memory device 720, a microprocessor (CPU) 712 a random access memory RAM 711, and an error checking and correcting (ECC) unit 714. The host interface 713 receives signals from the host and transmits the received signals to predetermined components of the memory card 700 through a bus. The flash memory device 720 includes a plurality of memory blocks, each memory block comprising a plurality of NAND cell units 131 sharing control lines (e.g., word lines WL<>, SSL and GSL). The memory controller/interface 715 controls the flow of data between the host and the NAND memory cell transistors in the memory device 720 in response to a control command from the host. The RAM 711 temporarily stores data when the memory card 700 is driven.

Examples of the host include personal computers, file servers, peripheral devices, wireless devices, digital cameras, personal digital assistants (PDA's), MP3 audio players, MPEG video players, and audio recorders. The removable memory card will typically have a housing that has a predetermined form factor and interface, such as SD (Secure Digital), MS (memory stick), CF (compact flash), SMC (smart media), MMC (multi media), or XD (XD-Picture Card), PCMCIA, CardBus, IDE, EIDE, SATA, SCSI, universal serial bus e.g., a USB flash drive) etc.

Figure 20:
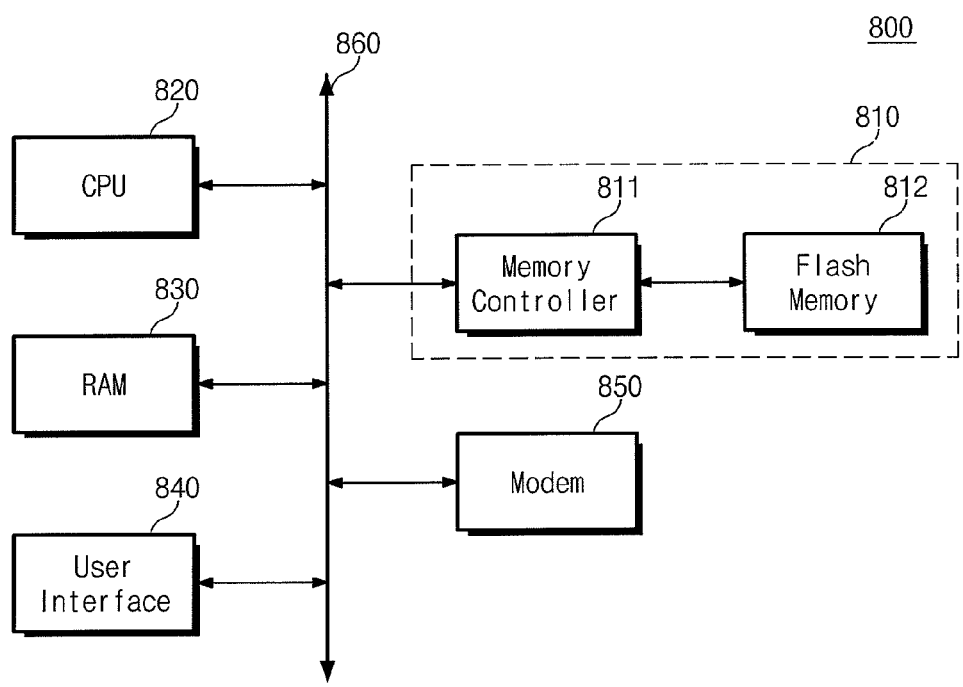
FIG. 20 is a block diagram of a computer system 800 including a flash memory system 810 including a flash memory device 812 (e.g., 100, 200, 300, 400, 500) according to any embodiment of the present invention.

FIG. 20 is a block diagram of a computer system 800 including a flash memory system 810 including a flash memory device 812 (e.g., 100, 200, 300, 400, 500) according to at least one embodiment of the present invention described above. The flash memory device 812 is coupled to a memory controller 811 for accessing the flash memory transistor array (e.g., see 130 in FIG. 2) in the flash memory device 812. The flash memory device 812 coupled to the memory controller 811 forms part of the computer system 800. Examples of the computer system 800 include personal computers, peripheral devices, wireless devices, digital cameras, personal digital assistants (PDA's), MP3 audio players, MPEG video players, digital audio recorders, and digital video recorders. The flash memory system 810 can be a memory card-based hard-drive, a Solid State Drive (SSD), a hybrid (SSD/magnetic) disk, a Camera Image Processor (CIS), an application chipset, or a memory core integrated with the CPU 820. A solid state drive (SSD) is a data storage device that typically emulates a conventional hard disk drive (HDD), thus easily replacing the HDD in most applications. In contrast to the rotating disk medium of an HDD, an SSD utilizes solid state NAND flash memory device to store data. With no moving parts, an SSD largely eliminates seek time, latency and other electromechanical delays and failures associated with a conventional HDD.

The memory device 812 of the flash memory system 800 of FIG. 20 receives control signals across control lines from the system bus 860 via the memory controller 811 to control access to the memory transistor array 130 in the memory device 812. Access to the memory cell transistor array 130 in the memory device 812 is directed to one or more target memory cell transistors MC<> using the integrated peripheral circuitry and via word lines WL<> and bit lines BL<> in the memory device 812. Once the memory cell transistor array is accessed in response to the control signals and the address signals, data is written to or read from the memory transistors by the integrated peripheral circuitry in the memory device 812.

The memory device 812 in the computer system 800. of FIG. 20, and the memory device 720 in the memory card 700 of FIG. 19 can be mounted in various package types, including Ball Grid Arrays (BGAs), Chip Scale Packages (CSPs), Plastic Leaded Chip Carrier (PLCC), Plastic Dual In-Line Package (PDIP), Multi Chip Package (MCP), Wafer-level Fabricated Package (WFP), Wafer-Level Processed Stack Package (WSP).

It is to be noted that in the exemplary embodiments described above and in the claims below, n and m are fixed integers determined at the design stage of manufacturing the flash memory device, and i, x, j and y are an positive integer variables. Further, in timing diagrams illustrated above, parameters depicted such as voltage levels may not be drawn to scale.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A method of programming a flash cell unit having n memory cell transistors MC<0> through MC<n−1>, respectively controlled by n wordlines WL<0> through WL<n−1>, connected in series between a ground select transistor GST and a string selection transistor SST controlled by a string selection line SSL, memory cell MC<n−1> being closest to the SST, wherein n is a real number, the method comprising:
   applying a first predetermined voltage Vcc or Vcc−α to the string selection line SSL; and
   applying a low voltage Vcutoff (Vss) to the wordline of an unselected memory cell transistor situated between the ground select transistor GST and a second selected wordline while applying a predetermined second voltage (Vcc−α or Vcc+α) to the SSL while applying a programming voltage Vpgm to the second selected wordline, wherein the voltage increase +α or the voltage decrease −α of the predetermined second voltage Vcc is sufficient to reduce the difference between the channel potential of a first plurality of the memory cell transistors and the channel potential of a second plurality of the memory cell transistors, wherein the first plurality includes a memory cell transistor between the GST and the unselected memory cell transistor, and the second plurality includes the memory cell transistor connected to the second selected wordline.

2. The method of claim 1, further comprising:
   not applying the predetermined second voltage (Vcc−α or Vcc+α) to the SSL while applying the programming voltage Vpgm to a first selected word line.

3. The method of claim 2, wherein the second selected wordline is closer to the string selection line SSL than the first selected wordline and applying the voltage increase +α or the voltage decrease −α of the predetermined second voltage Vcc to the SSL reduces the channel potential of the second plurality of memory cell transistors.

4. The method of claim 1, wherein a is between 0.1 volts and 3.0 volts inclusive, and Vcc is between 2.5 volts and 3.5 volts inclusive, and Vpgm is between 15 volts and 25 volts inclusive.

5. The method of claim 1, wherein the predetermined second voltage is Vcc+α.

6. The method of claim 5, further comprising removing the predetermined second voltage Vcc+α from the SSL and re-applying the first predetermined voltage Vcc to the string selection line SSL before removing the program voltage Vpgm from the second selected wordline.

7. The method of claim 3, wherein the first selected wordline is WL<i>, the second selected wordline is WL<i'>, wherein 0≦i<x, and i'≧x, and 0<x<n−1, wherein i, i' and x are each a real number;
   and wherein the second plurality of the memory cell transistors includes MC<i'> through MC<n−1>; and further comprising:
   applying a pass voltage Vpass, wherein Vpgm>Vpass>0, to memory cell transistors MC<i+1> through MC<n−1> while applying the programming voltage Vpgm to the first selected word line WL<i>; and at a different time applying the pass voltage Vpass to memory cell transistors MC<i'+1> through MC<n−1> while applying the programming voltage Vpgm to the second selected wordline WL<i'>.

8. The method of claim 2, wherein the first selected wordline is WL<i>, the second selected wordline is WL<i'>, wherein 0≦i <x, and i'≧x, and 0<x<n−1, wherein i, i' and x are each a real number; and wherein the value of x has been stored as set-up data in a flash memory device including the flash cell unit.

9. The method of claim 1, wherein the predetermined second voltage is Vcc-α, and further comprising:

applying the predetermined second voltage Vcc-α to the SSL and to a bit line BL connected to the SSL while programming the second selected wordline to reduce the channel potential of the second plurality of memory cell transistors.

10. A flash memory device, comprising:

a memory block including a plurality of m strings of memory cells sharing n wordlines WL<0> through WL<n−1> and sharing a string selection line (SSL), each cell string including:

a string selection transistor (SST) controlled by the SSL and a plurality of n memory transistors respectively controlled by the n wordlines WL<0> through WL<x−1> and WL<x> through WL<n−1>, wherein m, n and x are real numbers, and x is less than n−1;

and peripheral circuitry adapted to apply a first predetermined voltage Vcc to the string selection line (SSL), and to apply at a different time a predetermined second voltage Vcc±α to the string selection line (SSL) while programming the n memory transistors controlled by a second selected wordline selected from the wordlines WL<x> through WL<n−1>, wherein the second selected wordline is nearer than WL<0> to the string selection line (SSL), wherein +α is voltage increase and −α is a voltage decrease, wherein the predetermined second voltage Vcc±α is sufficient to reduce the difference between a channel potential of a first plurality of the memory cell transistors in a first string of memory cells among the m strings and a channel potential of a second plurality of the memory cell transistors in the first string, wherein the second plurality of the memory cell transistors includes the memory cell transistor connected to the second selected word line.

11. The device of claim 10, wherein each of the n memory transistors includes a control gate and a floating gate.

12. The device of claim 10, wherein each of the m cell strings is a NAND string.

* * * * *